(12) United States Patent
Joo et al.

(10) Patent No.: US 9,978,945 B2
(45) Date of Patent: May 22, 2018

(54) ORGANIC LIGHT EMITTING DISPLAY DEVICE

(71) Applicant: LG Display Co., Ltd., Seoul (KR)

(72) Inventors: SungHoon Joo, Gyeonggi-do (KR); Jeongdae Seo, Incheon (KR); Hyoseok Kim, Daejeon (KR); Hyeseung Kang, Seoul (KR); Seonkeun Yoo, Gyeonggi-do (KR); Min Yun, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 387 days.

(21) Appl. No.: 14/833,322

(22) Filed: Aug. 24, 2015

(65) Prior Publication Data

US 2016/0141502 A1    May 19, 2016

(30) Foreign Application Priority Data

Nov. 19, 2014  (KR) .......................... 10-2014-0161921

(51) Int. Cl.
*H01L 51/50*  (2006.01)
*H01L 51/00*  (2006.01)
*C09K 11/06*  (2006.01)

(52) U.S. Cl.
CPC .......... *H01L 51/0052* (2013.01); *C09K 11/06* (2013.01); *H01L 51/0067* (2013.01); *H01L 51/504* (2013.01); *C09K 2211/1011* (2013.01); *C09K 2211/1044* (2013.01); *H01L 51/0054* (2013.01); *H01L 51/0072* (2013.01); *H01L 51/0074* (2013.01); *H01L 51/5012* (2013.01); *H01L 51/5044* (2013.01); *H01L 51/5072* (2013.01)

(58) Field of Classification Search
None
See application file for complete search history.

(56) References Cited

U.S. PATENT DOCUMENTS

2014/0117337 A1*  5/2014  Jung .................. H01L 51/5044
                                                                       257/40
2014/0167016 A1    6/2014  Yoo et al.

FOREIGN PATENT DOCUMENTS

WO       2010/126270 A1    11/2010
WO    WO 2010/126270    *  11/2010  ............. C09K 11/06

OTHER PUBLICATIONS

Extended European Search Report dated Mar. 24, 2016 issued by the European Patent Office in corresponding European Patent Application No. 15182179.0.

* cited by examiner

*Primary Examiner* — Gregory D Clark
(74) *Attorney, Agent, or Firm* — Morgan, Lewis & Bockius LLP

(57) ABSTRACT

An organic light emitting display device is disclosed. The organic light emitting display device comprises at least two light emitting parts between an anode and a cathode, each of the light emitting parts having a light emitting layer and an electron transport layer, charge generation layers between the at least two light emitting parts, wherein at least one among the electron transport layers in the at least two light emitting parts includes a pyrimidine derivative at both sides of the core so as to reduce a driving voltage and increase an efficiency of the organic light emitting display device.

14 Claims, 4 Drawing Sheets

ORGANIC LIGHT EMITTING DISPLAY DEVICE

This application claims the priority benefit of Korean Patent Application No. 10-2014-0161921 filed on Nov. 19, 2014, which is hereby incorporated herein by reference for all purposes as if fully set forth herein.

BACKGROUND

Field of the Invention

The present invention relates to an organic light emitting display device, and more particularly, to an organic light emitting display device having reduced driving voltage and improved efficiency.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on flat panel displays such as liquid crystal displays (LCD), plasma display panels (PDP), electroluminescent displays (ELD), field emission displays (FED), organic light emitting diodes (OLED), etc is actively under way.

Among these types of panel displays, the OLED devices are a type of devices that emit light as electrons and holes are paired and extinguished, when a charge is injected into an organic light emitting layer between an anode and a cathode. The OLED devices are advantageous in that they can be formed on a flexible transparent substrate such as plastic, can be driven at relatively low voltage, less power consumption, and excellent color sensitivity, as compared to plasma display panels or inorganic EL displays. Especially, white OLED devices are used for various purposes in lighting, thin light sources, backlights for liquid crystal displays, or full-color displays employing color filters.

In the development of white OLED devices, high efficiency, long lifetime, color purity, color stability against current and voltage variations, ease of manufacture, etc are important, so research and development are being done depending on which of these features should be taken into account. White OLED device structures may be roughly classified into a single-layer emitting structure and a multilayer emitting structure. Of these structures, the multilayer emitting structure having a blue fluorescent emitting layer and a yellow phosphorescent emitting layer stacked in tandem is mainly employed to realize white OLED devices with long lifetime.

Specifically, a phosphorescent emitting structure is used, which is a lamination of a first light emitting part using a blue fluorescent diode as a light emitting layer and a second light emitting part using a yellow phosphorescent diode as a light emitting layer. Such a white OLED device produces white light by mixing blue light emitted from the blue fluorescent diode and yellow light emitted from the yellow phosphorescent diode. A charge generation layer is formed between the first light emitting part and the second light emitting part to double the current efficiency generated in the light emitting layers and facilitate charge distribution. The charge generation layer includes an N-type charge generation layer and a P-type charge generation layer.

However, the overall operating voltage of a device having the aforementioned multilayer emitting structure may be higher than the sum of the operating voltages of individual light emitting parts, or the multilayer emitting device may decrease in efficiency compared to a single-layer emitting structure. Especially, if the N-type charge generation layer is doped with an alkali metal or alkali earth metal, the lifetime of the device may be decreased. Also, the difference in LUMO (lowest unoccupied molecular orbital) energy level between the P-type charge generation layer and the N-type charge generation layer deteriorates the property of injecting electrons generated at the interface between the P-type charge generation layer and the hole transport layer into the N-type charge generation layer. Moreover, the difference in LUMO energy level between the electron transport layer and the N-type charge generation layer causes a rise in operating voltage when the electrons injected into the N-type charge generation layer move to the electron transport layer.

SUMMARY

Accordingly, the present invention is directed to an organic light emitting display device that substantially obviates one or more of the problems due to limitations and disadvantages of the related art.

An object of the present invention is to provide a pyrimidine derivative which is capable of reducing operating voltage and improving emission efficiency and an organic light emitting display device comprising the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an organic light emitting display device comprises, at least two light emitting parts between an anode and a cathode, each of the light emitting parts having a light emitting layer and an electron transport layer, and charge generation layers between the at least two light emitting parts, wherein at least one among the electron transport layers in the at least two light emitting parts includes a compound represented by the following Chemical Formula 1:

[Chemical Formula 1]

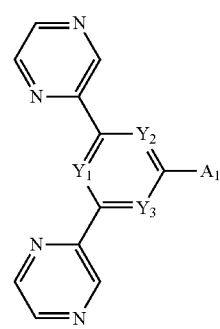

where $Y_1$, $Y_2$, and $Y_3$ are independently one among N, C, O, S, and Si, wherein at least one among $Y_1$, $Y_2$, and $Y_3$ is N, and $A_1$ is an aromatic ring compound having 6 to 50 carbon atoms or a hetero ring compound having 5 to 50 carbon atoms having one among N, O, S, and Si atoms.

In another aspect, an organic layer comprises a pyrimidine derivative having one or more electrons with high electronegativity, among materials with electron properties, so as to reduce an operating voltage of an organic light emitting display device and increase an efficiency of the organic light emitting display device.

In other aspect, an organic light emitting display device comprises at least two light emitting parts between an anode and a cathode, each of the light emitting parts having a light emitting layer and an electron transport layer, and charge generation layers between the at least two light emitting parts, wherein at least one among the electron transport layers in the at least two light emitting parts includes s a pyrimidine derivative at both sides of the core so as to reduce an operating voltage and increase an efficiency of the organic light emitting display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
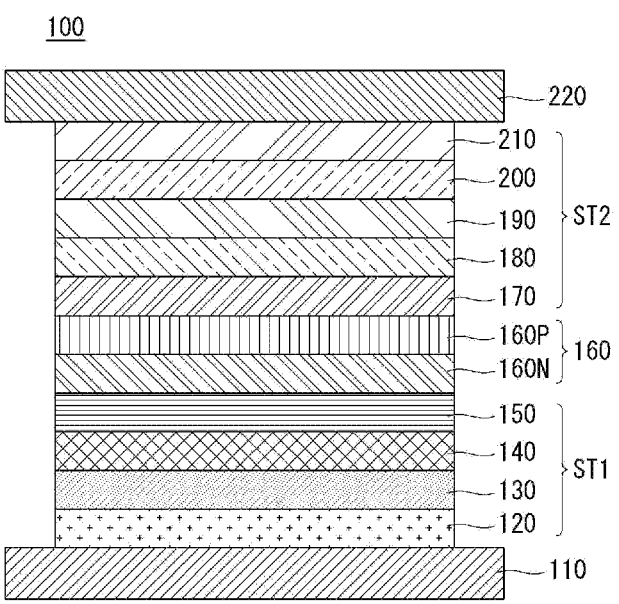
FIG. 1 is a cross-sectional view showing an organic light emitting display device according to a first exemplary embodiment of the present invention.

The advantages and features of the present invention and methods for accomplishing the same may be understood more readily by reference to the following detailed descriptions of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the present invention to those skilled in the art, and the present invention is defined by the appended claims The shapes, sizes, percentages, angles, numbers, etc. shown in the figures to describe the exemplary embodiments of the present invention are merely examples and not limited to those shown in the figures. Like reference numerals denote like elements throughout the specification. In describing the present invention, detailed descriptions of related well-known technologies will be omitted to avoid unnecessary obscuring the present invention. When the terms 'comprise', 'have', 'consist of' and the like are used, other parts may be added as long as the term 'only' is not used. The singular forms may be interpreted as the plural forms unless explicitly stated.

The elements may be interpreted to include an error margin even if not explicitly stated.

When the position relation between two parts is described using the terms 'on', 'over', 'under', 'next to' and the like, one or more parts may be positioned between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present invention.

The features of various exemplary embodiments of the present invention may be combined with one another partly or wholly, and may technically interact or work together in various ways. The exemplary embodiments may be carried out independently or in combination with one another.

Hereinafter, various exemplary embodiments of the present invention will be described in detail with reference to the accompanying drawings.

FIG. 1 is a cross-sectional view showing an organic light emitting display device according to a first exemplary embodiment of the present invention.

Referring to FIG. 1, an organic light emitting display device 100 according to the first exemplary embodiment of the present invention comprises light emitting parts ST1 and ST2 between an anode 110 and a cathode 220, and a charge generation layer 160 between the light emitting parts ST1 and ST2. The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The first light emitting part ST1 is a single light emitting diode unit, and comprises a first hole injection layer 120, a first hole transport layer 130, a blue light emitting layer 140, and a first electron transport layer 150. The blue light emitting layer 140 comprises at least one among a blue light emitting layer, a dark blue light emitting layer, or a sky blue light emitting layer.

The first hole injection layer 120 may function to facilitate hole injection from the anode 110 to the blue light emitting layer 140, and may be formed of, but is not limited to, one among CuPc (copper phthalocyanine), PEDOT (poly(3,4)-ethylenedioxythiophene), PANI (polyaniline), and NPD ((N, N'-bis(naphthalene-1-yl)-N,N'-bis(phenyl)-2,2'-dimethylbenzidine). The first hole injection layer 120 may be 1 to 150 nm thickness. If the first hole injection layer 120 is 1 nm thickness or greater, the hole injection properties may be improved, or if the first hole injection layer 120 is 150 nm thickness or less, an increase in the thickness of the first hole injection layer 120 may be prevented and a rise in operating voltage may be therefore prevented. The first hole injection layer 120 may not be included in the composition of the organic light emitting display device, depending on the structure or characteristics of the organic light emitting display device.

The first hole transport layer 130 may function to facilitate hole transport, and may be formed of, but is not limited to, one among NPD (N,N'-bis(naphthalene-1-yl)-N,N'-bis(phenyl)-2,2'-dimethylbenzidine), TPD (N,N'-bis-(3-methylphenyl)-N,N'-bis(phenyl)-benzidine), spiro-TAD (2,2'7,7'-tetrakis(N,N-diphenylamino)-9,9'-spirofluorene), and MTDATA (4,4',4"-Tris(N-3-methylphenyl-N-phenylamino)-triphenylamine). The first hole transport layer 130 may be 1 to 150 nm thickness. If the first hole transport layer 130 is 1 nm thickness or greater, the hole transport properties may be improved, or if the first hole transport layer 130 is 150 nm thickness or less, an increase in the thickness of the first hole transport layer 130 may be prevented, and a rise in operating voltage may be therefore prevented.

The blue light emitting layer 140 may be formed of, but is not limited to, a phosphorescent material comprising a host material such as CBP (4,4'-bis(carbazole-9-yl)biphenyl) and a dopant material having an iridium-based material. Alternatively, the blue light emitting layer 140 may be formed of, but is not limited to, a fluorescent material having any one among spiro-DPVBi, spiro-CBP, distyrylbenzene (DSB), distyrylarylene (DSA), a PFO polymer, and a PPV polymer.

The first electron transport layer 150 functions to facilitate electron transport, and affects the lifetime or efficiency of the organic light emitting display device. The first electron transport layer 150 may be formed of, but is not limited to, one among $Alq_3$ (tris(8-hydroxyquinolinato)aluminum), PBD (2-(4-biphenyl)-5-(4-tert-butylphenyl)-1,3,4-oxadiazole), TAZ (3-(4-biphenyl)-4-phenyl-5-tert-butylphenyl-1,2,4-triazole), and BAlq (Bis(2-methyl-8-quinolinolate)-4-(phenylphenolato)aluminum). The first electron transport layer 150 may be 1 to 150 nm thickness. If the first electron transport layer 150 is 1 nm thickness or greater, a degradation of the electron transport properties may be prevented, or if the first electron transport layer 150 is 150 nm thickness or less, an increase in the thickness of the first electron transport layer 150 may be prevented, and a rise in operating voltage may be therefore prevented.

A charge generation layer (CGL) 160 is over the first light emitting part ST1. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layers. That is, the N-type charge generation layer 160N supplies electrons to the blue light emitting layer 140 adjacent to the anode, and the P-type charge generation layer 160P supplies holes to the light emitting layer of the second light emitting part ST2. As such, the organic light emitting display device with a plurality of light emitting layers can further increase its emission efficiency and lower its operating voltage. Accordingly, the charge generation layer 160 has a major effect on the organic light emitting display device's characteristics, i.e., emission efficiency and operating voltage.

The N-type charge generation layer 160N may be formed of a metal or an N-doped organic material. The metal may be one material among Li, Na, K, Rb, Cs, Mg, Ca, Sr, Ba, La, Ce, Sm, Eu, Tb, Dy, and Yb. An N-type dopant and host for the N-doped organic material may be commonly-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 1 and 8% relative to 100% for the host. The dopant may have a work function of 2.5 eV or greater. The host material may be an organic material that has a nitrogen-atom having hetero ring, with 20 to 60 carbon atoms, for example, one among tris(8-hydroxyquinoline)aluminum, triazine, a hydroxyquinoline derivative, a benzazole derivative, and a silole derivative.

The P-type charge generation layer 160P may be formed of a metal or a P-doped organic material. The metal may be one or more alloys among Al, Cu, Fe, Pb, Zn, Au, Pt, W, In, Mo, Ni, and Ti. A P-type dopant and host for the P-doped organic material may be commonly-used materials. For example, the P-type dopant may be a material among $F_4$-TCNQ (2,3,5,6-tetrafluoro-7,7,8,8,-tetracyanoquinodemethane), a derivative of tetracyanoquinodemethane, iodine, $FeCl_3$, $FeF_3$, and $SbCl_5$. The host may be a material among NPB (N,N'-bis(naphthalene-1-yl)-N,N'-bis(phenyl)-benzidine), TPD (N,N'-bis-(3-methylphenyl)-N,N'-bis(phenyl)-benzidine), and TNB (N,N,N'N'-tetranaphthalenyl-benzidine).

The second light emitting part ST2 comprising a second hole injection layer 170, a second hole transport layer 180, a yellow light emitting layer 190, a second electron transport layer 200, and an electron injection layer 210 is over the charge generation layer 160. The second hole injection layer 170, second hole transport layer 180, and second electron transport layer 200 may have the same composition as the first hole injection layer 120, first hole transport layer 130, and first electron transport layer 150 of the above-described first light emitting part ST1, respectively, or have different compositions from their compositions.

The yellow light emitting layer 190 may have a single layer structure of a yellow-green light emitting layer or a green light emitting layer, or a multilayer structure composed of a yellow-green light emitting layer and a green light emitting layer. As used herein, the yellow light emitting layer 190 comprises a yellow-green light emitting layer, a green light emitting layer, or a multilayer structure composed of a yellow-green light emitting layer and a green light emitting layer. This exemplary embodiment will be described by taking as an example a single layer structure of a yellow-green light emitting layer that emits yellow-green light. The yellow-green light emitting layer 190 may have at least one host among CBP (4,4'-bis(carbazol-9-yl)biphenyl) and BAlq (Bis(2-methyl-8-quinolinolate)-4-(phenylphenolato)aluminum) and a phosphorescent yellow-green dopant that emits yellow-green light.

The second electron transport layer 200 functions to facilitate electron transport, and affects the lifetime or efficiency of the organic light emitting display device. Thus, the present inventors conducted several tests or experiments to improve the electron injection properties of the electron transport layer. Through a number of tests or experiments which were performed on materials that do not affect the lifetime, etc. of the organic light emitting display device, a pyrimidine derivative was chosen as the electron transport layer. The pyrimidine derivative facilitates charge transport with its high electron mobility because an electron-rich pyrimidine is bound to both sides of the core. Moreover, the pyrimidine derivative facilitates electron transport from the electron transport layer to the light emitting layer by comprising a pyrimidine having one or more electrons with high electronegativity.

Accordingly, the second electron transport layer 200 includes a pyrimidine derivative represented by the following Chemical Formula 1:

[Chemical Formula 1]

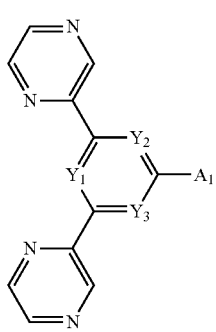

where $Y_1$, $Y_2$, and $Y_3$ are independently one among N, C, O, S, and Si, wherein at least one among $Y_1$, $Y_2$, and $Y_3$ is N, and $A_1$ is an aromatic ring compound having 6 to 50 carbon atoms or a heterocyclic compound having 5 to 50 carbon atoms having one among N, O, S, and Si atoms.

The pyrimidine derivative includes one among the following compounds:

Py-1

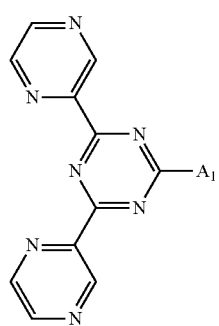

Py-2

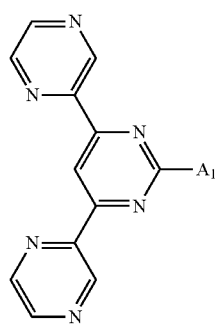

Py-3

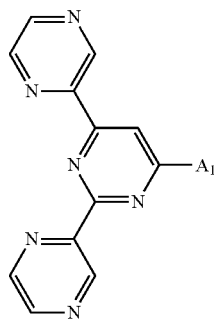

Py-4

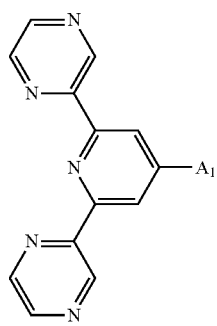

Py-5

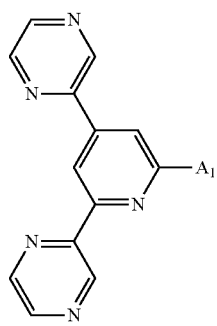

where $A_1$ includes one among the following compounds:

A-01

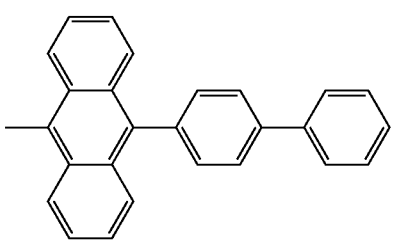

A-02

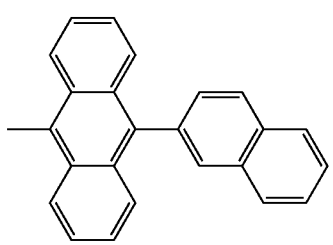

A-03
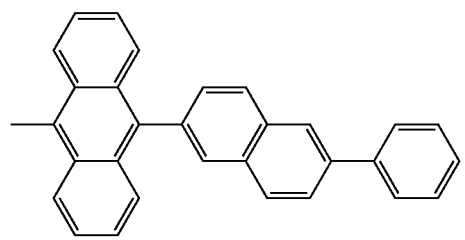
A-04
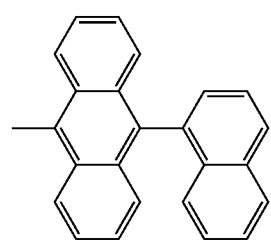
A-05
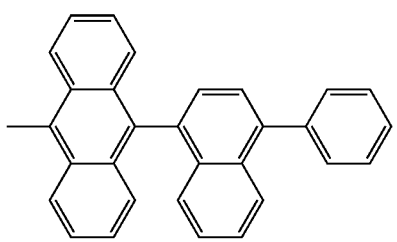
A-06
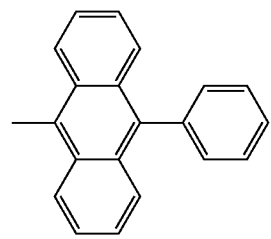
A-07
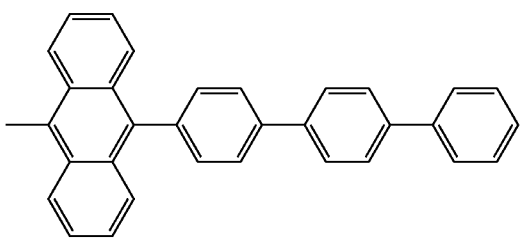
A-08
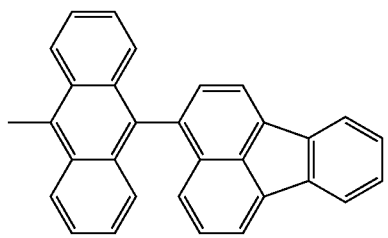
A-09
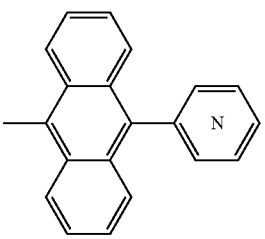
A-10
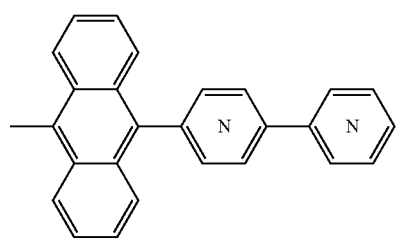
A-11
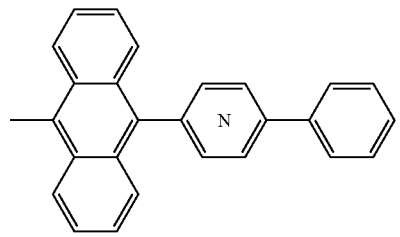
A-12
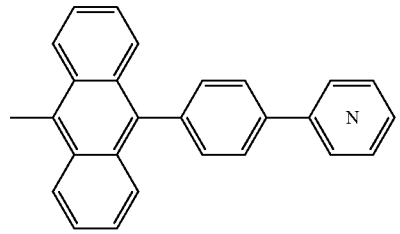
A-13
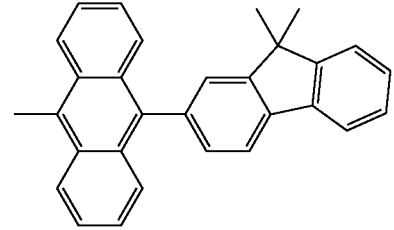
A-14
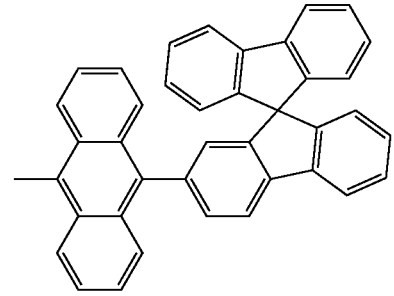

A-15
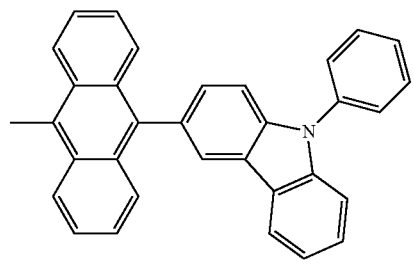
A-16
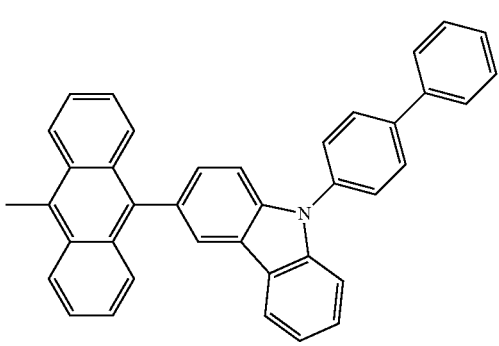
A-17
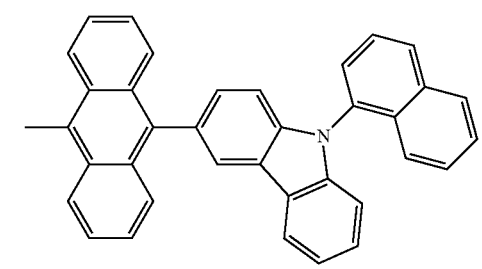
A-18
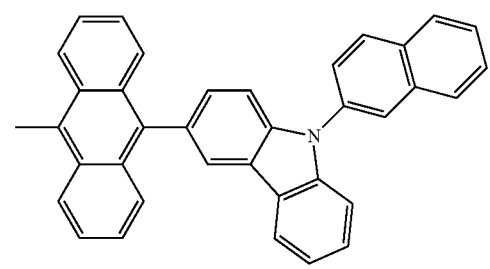
A-19
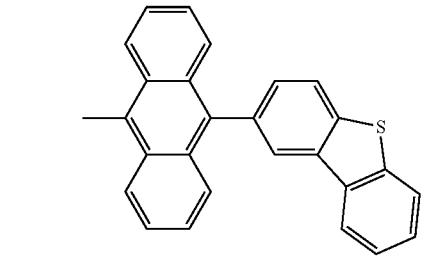
A-20
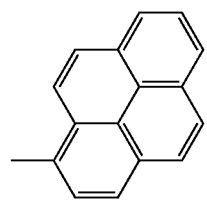
A-21
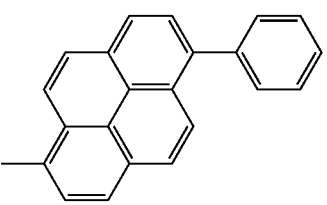
A-22
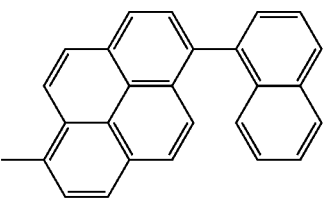
A-23
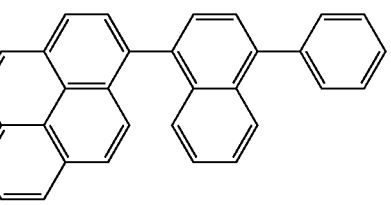
A-24
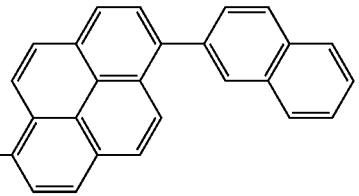
A-25
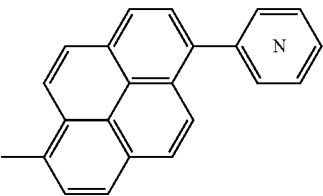
A-26
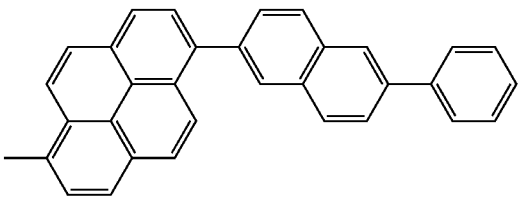
A-27
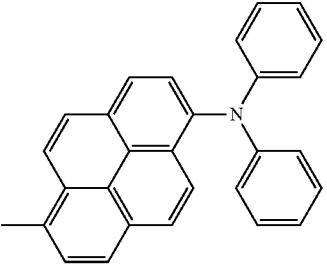

A-28
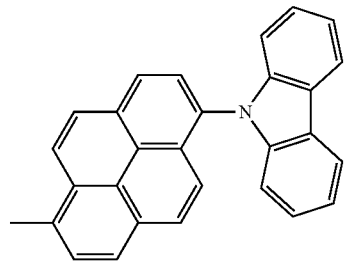
A-29
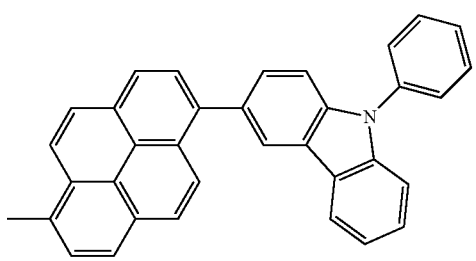
A-30
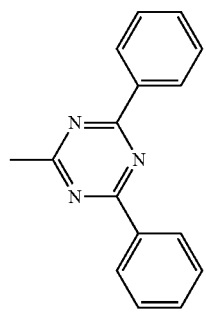
A-31
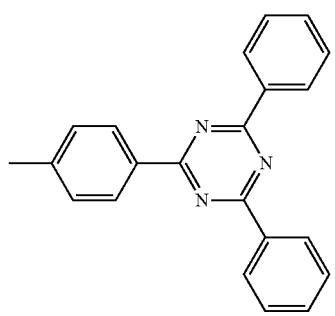
A-32
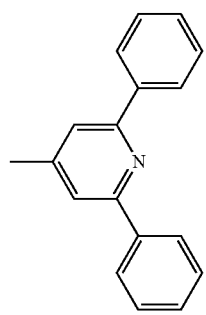
A-33
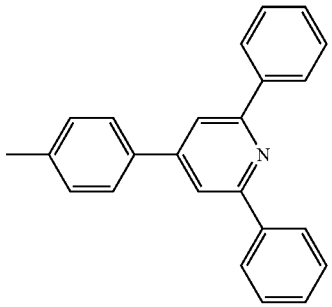
A-34
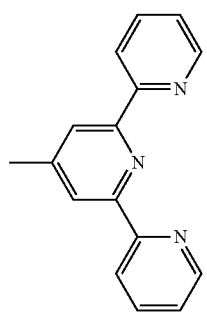
A-35
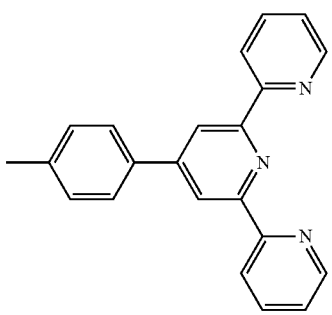
A-36
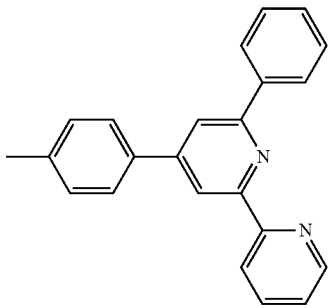
A-37
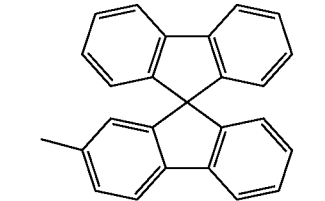

A-38, A-39, A-40, A-41, A-42, A-43, A-44, A-45, A-46, A-47, A-48, A-49, A-50, A-51, A-52

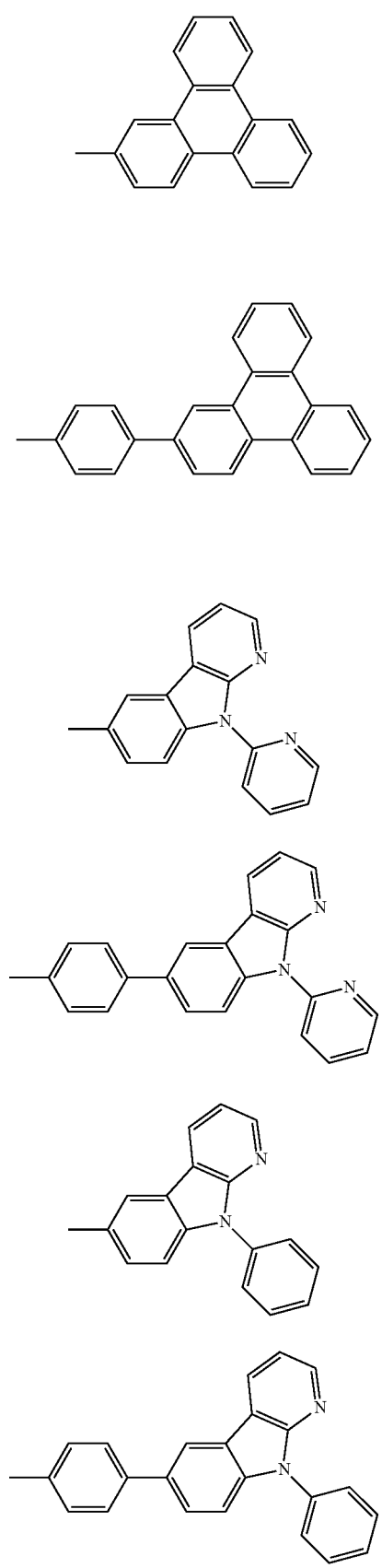
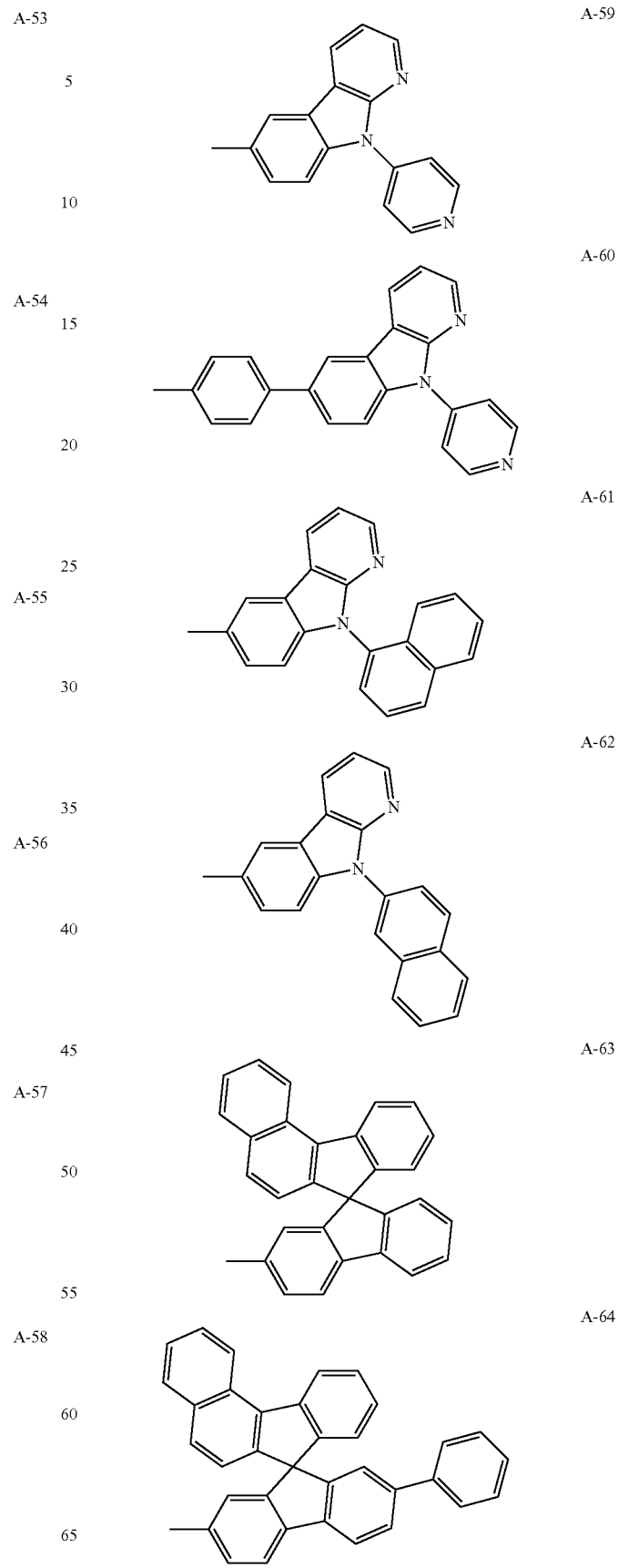

-continued
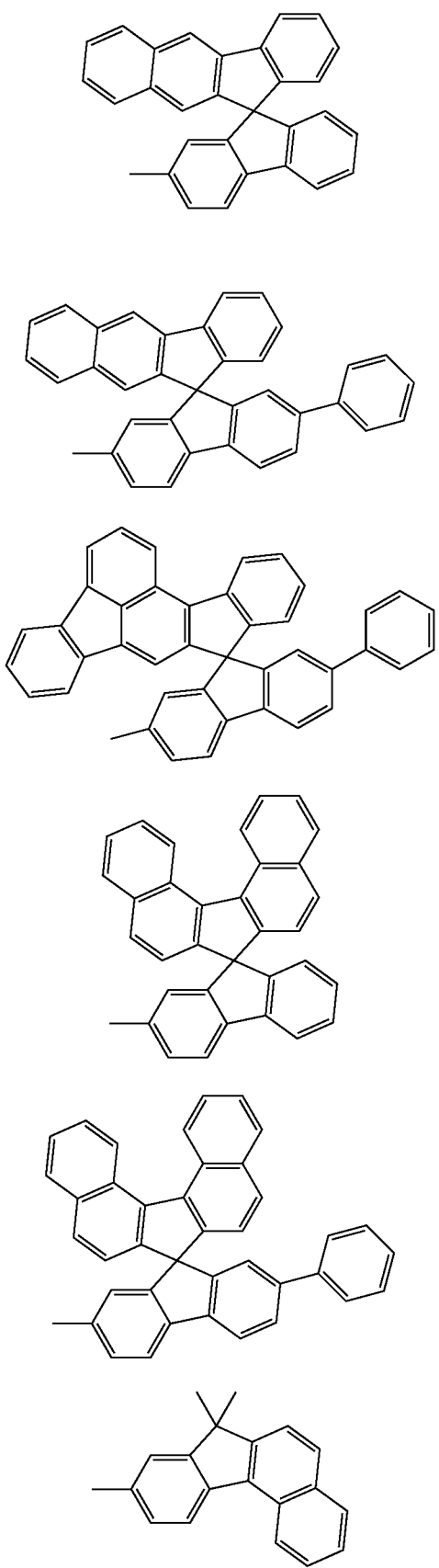
A-65
A-66
A-67
A-68
A-69
A-70
-continued
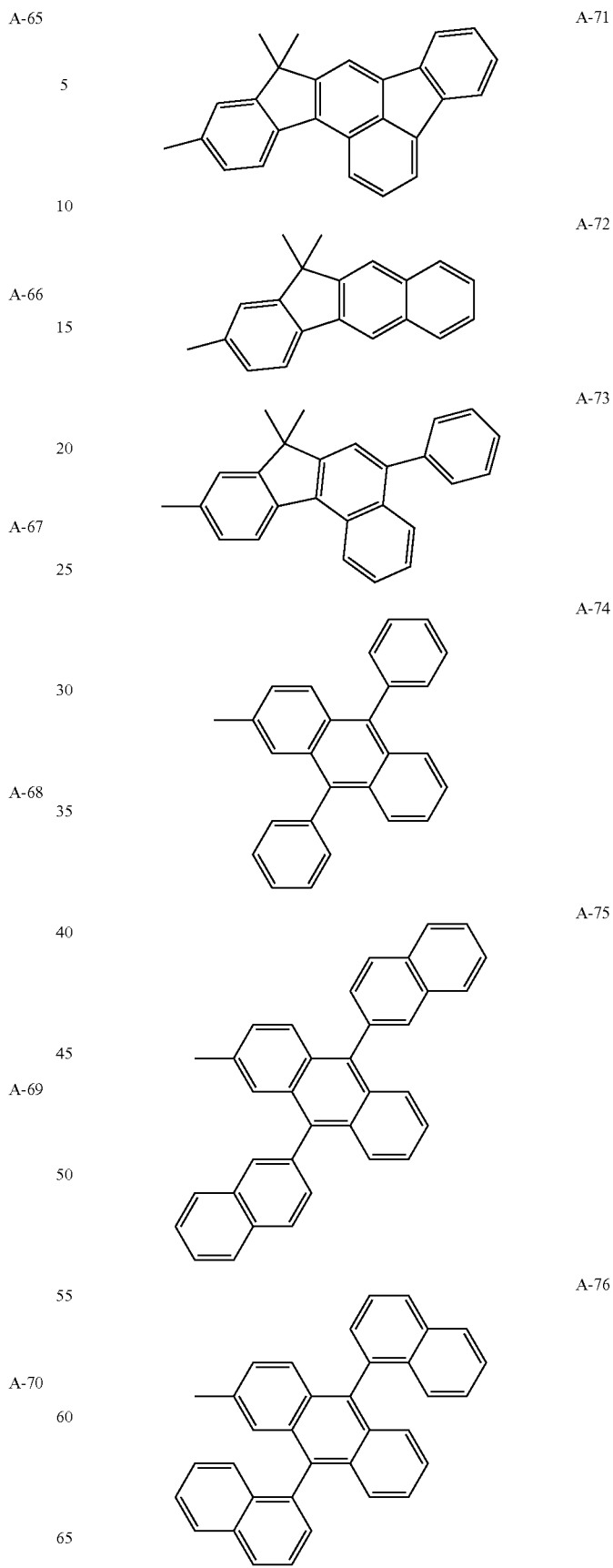
A-71
A-72
A-73
A-74
A-75
A-76

-continued

A-77
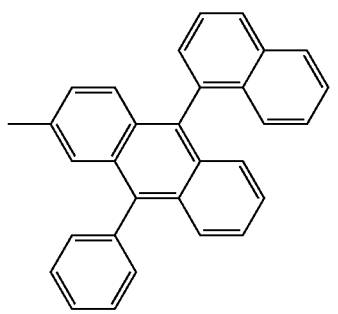

A-78
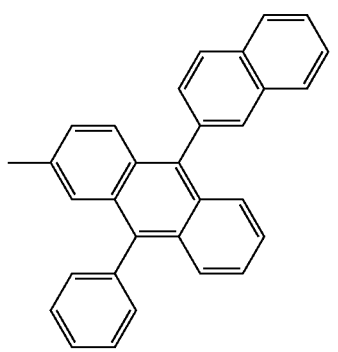

A-79
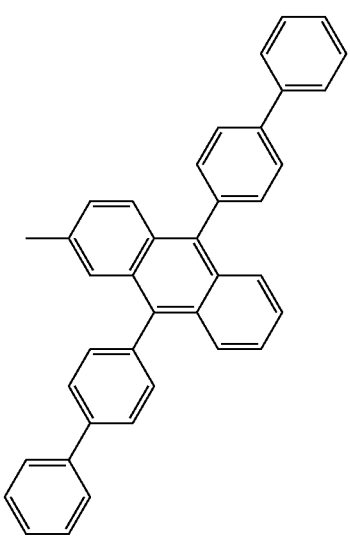

where

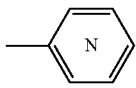

includes one among

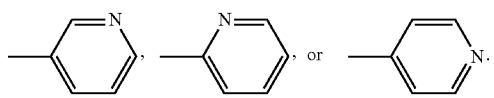

Although the present invention has been described with respect to a pyrimidine derivative in the second electron transport layer 200, the present invention is not limited thereto, and the pyrimidine derivative also may be in the first electron transport layer 150 if necessary. The pyrimidine derivative of the present invention may be in the electron transport layer adjacent to the yellow-green light emitting layer that emits yellow-green light.

The electron injection layer 210 functions to facilitate electron transport, and may be formed among, but is not limited to, Alq$_3$ (tris(8-hydroxyquinolinato)aluminum), PBD (2-4-biphenyl)-5-(4-tert-butylphenyl)-1,3,4-oxadiazole), TAZ (3-(4-biphenyl)-4-pheynyl-5-tert-butylphenyl-1,2,4-triazole), or BAlq (Bis(2-methyl-8-quinolinolate)-4-(phenylphenolato)aluminum). On the other hand, the electron injection layer 210 may be formed of a metal compound, and the metal compound may be, for example, but is not limited to, one or more among LiQ, LiF, NaF, KF, RbF, CsF, FrF, BeF$_2$, MgF$_2$, CaF$_2$, SrF$_2$, BaF$_2$, and RaF$_2$. The electron injection layer 210 may be 1 to 50 nm thickness. If the electron injection layer 210 is 1 nm thickness or greater, a degradation of the electron injection properties may be prevented, or if the electron injection layer 210 is 50 nm thickness or less, an increase in the thickness of the electron injection layer 210 may be prevented, and a rise in operating voltage may be therefore prevented. Accordingly, the second light emitting part ST2 comprising the second hole injection layer 170, the second hole transport layer 180, the yellow light emitting layer 190, the second electron transport layer 200, and the electron injection layer 210 is formed over the charge generation layer 160.

The cathode 220 is over the second light emitting part ST2. The cathode 220 is an electron injection electrode, and may be formed among magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

As stated above, the present invention allows for smooth movement of electrons transferred from the N-type charge generation layer to the electron transport layer and the light emitting layer by using a pyrimidine derivative as at least one among the electron transport layers in the light emitting parts.

Moreover, the pyrimidine derivative, when used as the electron transport layer, facilitates charge transport with its high electron mobility; especially, it facilitates electron transport to the light emitting layer by comprising a pyrimidine having one or more electrons with high electronegativity. In addition, the pyrimidine derivative facilitates charge transport from the N-type charge generation layer to the light emitting layer.

Figure 2:
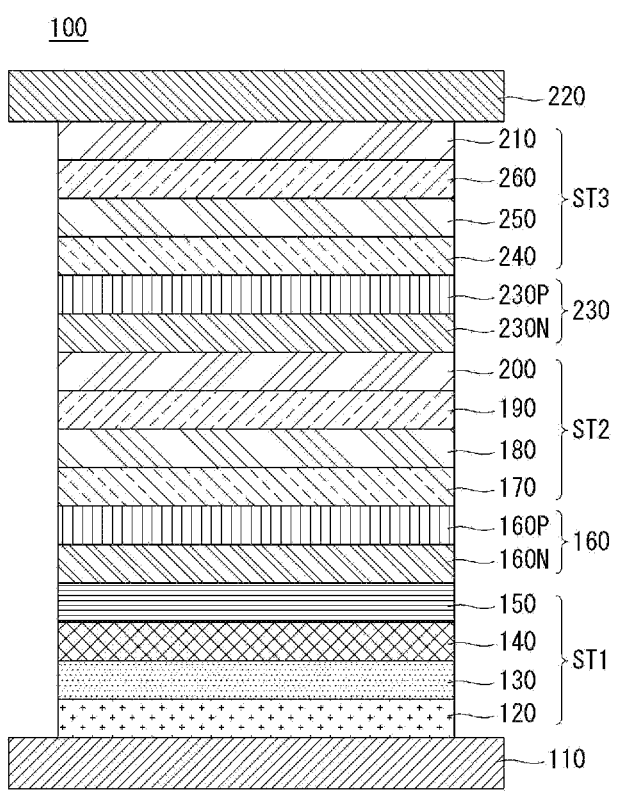
FIG. 2 is a cross-sectional view showing an organic light emitting display device according to a second exemplary embodiment of the present invention.

FIG. 2 is a view showing an organic light emitting display device according to a second exemplary embodiment of the present invention. The same elements as the first exemplary embodiment are denoted by the same reference numerals, so descriptions of these elements will be omitted below.

Referring to FIG. 2, an organic light emitting display device 100 of the present invention comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present invention is not limited to this example and four or more light emitting parts may be between the anode 110 and the cathode 220.

More specifically, the first light emitting part ST1 is a single light emitting diode unit, and comprises a first light emitting layer 140. The first light emitting layer 140 may emit light of at least one among red, green, or blue: for example, it may be a blue light emitting layer in this exemplary embodiment. The first light emitting part ST1 further comprises a hole injection layer 120 and a first hole transport layer 130 that are between the anode 110 and the first light emitting layer 140. Also, the first light emitting part ST1 further comprises a first electron transport layer 150 over the first light emitting layer 140. Accordingly, the first light emitting part ST1 comprising the hole injection layer 120, the first hole transport layer 130, the first light emitting layer 140, and the first electron transport layer 150 is formed over the anode 110. The hole injection layer 120 and the first hole transport layer 130 may not be included in the composition of the first light emitting part ST1, depending on the structure or characteristics of the device.

The first charge generation layer 160 is over the first light emitting part ST1. The first charge generation layer 160 is a PN-junction charge generation layer, formed by joining an N-type charge generation layer 160N and a P-type charge generation layer 160P, which generates a charge, or injects the charge, i.e., electrons and holes, separately into the light emitting layers.

The second light emitting part ST2 comprising a second light emitting layer 190 is over the first charge generation layer 160. The second light emitting layer 190 may emit light of at least one among red, green, or blue, and it may be a yellow light emitting layer, for example, in this exemplary embodiment. The yellow light emitting layer may comprise a yellow-green light emitting layer, a green light emitting layer, or a multilayer structure of a yellow-green light emitting layer and a green light emitting layer. The second light emitting part ST2 further comprises a second hole injection layer 170 and a second hole transport layer 180 that are between the first charge generation layer 160 and the second light emitting layer 190, and a second electron transport layer 200 over the second light emitting layer 190. The second electron transport layer 200 has the same composition as the first electron transport layer 150, so its description will be omitted. Accordingly, the second light emitting part ST2 comprising the second hole injection layer 170, the second hole transport layer 180, the second light emitting layer 190, and the second electron transport layer 200 is formed over the first charge generation layer 160.

The second electron transport layer 200 includes a pyrimidine derivative, like the foregoing first exemplary embodiment. The pyrimidine derivative facilitates charge transport with its high electron mobility because an electron-rich pyrimidine is bound to both sides of the core. Moreover, the pyrimidine derivative facilitates electron transport from the electron transport layer to the light emitting layer by comprising a pyrimidine having one or more electrons with high electronegativity.

The second charge generation layer 230 is over the second light emitting part ST2. The second charge generation layer 230 is a PN-junction charge generation layer, formed by joining an N-type charge generation layer 230N and a P-type charge generation layer 230P, which generates a charge, or injects the charge, i.e., electrons and holes, separately into the light emitting layers. The N-type charge generation layer 230N has the same composition as the N-type charge generation layer 160N of the first charge generation layer 160, so its description will be omitted. The P-type charge generation layer 230P also has the same composition as the aforementioned P-type charge generation layer 160P of the first charge generation layer 160.

The third light emitting part ST3 comprising a third light emitting layer 250 is over the second charge generation layer 230. The third light emitting layer 250 may emit light of at least one among red, green, or blue: for example, it may be a blue light emitting layer in this exemplary embodiment. The blue light emitting layer comprises at least one among a blue light emitting layer, a dark blue light emitting layer, or a sky blue light emitting layer. The third light emitting part ST3 further comprises a third hole transport layer 240 between the second charge generation layer 230 and the third light emitting layer 250, and a third electron transport layer 260 and an electron injection layer 210 that are over the third light emitting layer 250. The third electron transport layer 260 has the same composition as the aforementioned first electron transport layer 150, so its description will be omitted. Accordingly, the third light emitting part ST3 comprising the third hole transport layer 240, the third light emitting layer 250, the third electron transport layer 260, and the electron injection layer 210 is formed over the second charge generation layer 230. The cathode 220 is formed over the third light emitting part ST3 to constitute the organic light emitting display device according to the second exemplary embodiment of the present invention.

Although the second exemplary embodiment of the present invention has been described with respect to a pyrimidine derivative in the second electron transport layer 200, the present invention is not limited thereto, and at least one among the first, second, and third electron transport layers 150, 200, and 260 may include a pyrimidine derivative. The pyrimidine derivative facilitates charge transport with its high electron mobility because an electron-rich pyrimidine is bound to both sides of the core. Moreover, the pyrimidine derivative facilitates electron transport from the electron transport layer to the light emitting layer by comprising a pyrimidine having one or more electrons with high electronegativity.

Figure 3:
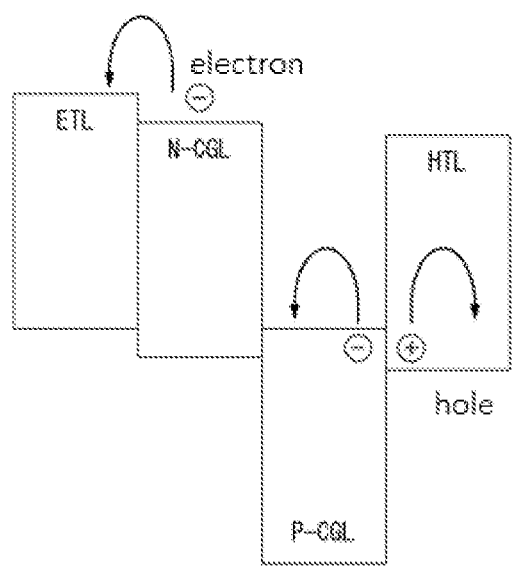
FIG. 3 is an energy band diagram of an organic light emitting display device according to an exemplary embodiment of the present invention.

FIG. 3 is an energy band diagram of an organic light emitting display device according to an exemplary embodiment of the present invention.

Referring to FIG. 3, an organic light emitting display device of the present invention comprises a hole transport layer HTL, a P-type charge generation layer P-CGL, an N-type charge generation layer N-CGL, and an electron transport layer ETL. The N-type charge generation layer N-CGL supplies electrons to the electron transport layer ETL adjacent to the N-type charge generation layer N-CGL, and the P-type charge generation layer P-CGL supplies holes to the hole transport layer HTL adjacent to the P-type charge generation layer P-CGL. The N-type charge generation layer N-CGL has $sp^2$ hybrid orbital nitrogen, and the nitrogen is bound to an alkali metal or alkali earth metal, i.e., a dopant for the N-type charge generation layer, thereby forming a gap state. This gap state may facilitate transfer of electrons from the P-type charge generation layer P-CGL to the N-type charge generation layer N-CGL. Also, the electron transport layer ETL comprises a pyrimidine derivative that facilitates charge transport with its high electron mobility. Especially, the pyrimidine derivative has one or more electrons with high electronegativity, which facilitates electron transport to the light emitting layer. Also, the pyrimidine derivative facilitates charge movement from the N-type charge generation layer to the light emitting layer. Accordingly, the electron injection capability of the device is improved, thereby improving emission efficiency and reducing the operating voltage of the device.

Hereinafter, synthesis examples of pyrimidine derivatives of the present invention will be described in detail. However, the following examples are only for illustration, and the present invention is not limited thereto.

Synthesis of Compound A01

1) Synthesis of 2-(4-(4-bromophenyl)-6-(pyrazin-2-yl)pyridin-2-yl)pyrazine

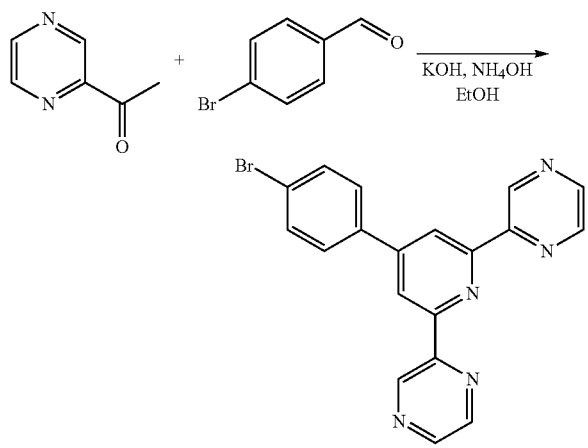

2-Acetylpyrazine (9.7 g, 80 mmol) and bromobenzaldehyde (7.4 g, 40 mmol) were dissolved in ethanol (EtOH) (200 mL) under a nitrogen atmosphere, and then potassium carbonate (KOH) (4.48 g, 80 mmol) and an ammonia aqueous solution (aq NH$_3$) (120 mL, 28-30%, 50 mmol) were put into the mixture and stirred for 5 hours. After completion of the reaction, the solid precipitation was vacuum-filtered and washed with ethanol (3×20 mL), and then recrystallized with methylene chloride methanol (MC-MeOH), whereby 2-(4-(4-bromophenyl)-6-(pyrazin-2-yl)pyridin-2-yl)pyrazine) (9.8 g, yield: 62.8%) was obtained.

Synthesis of Compound A01

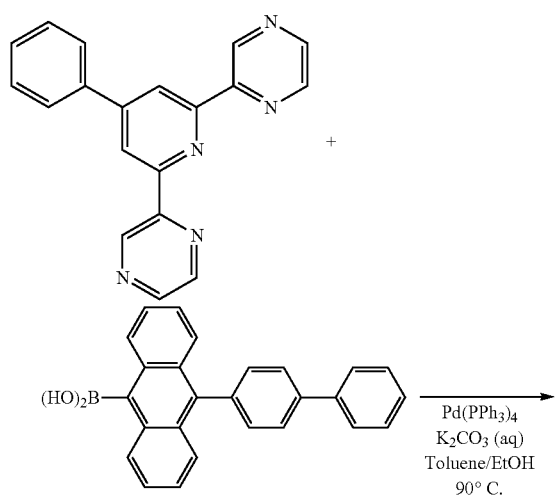

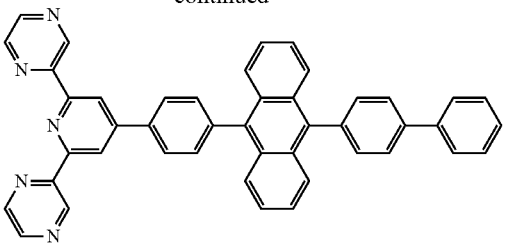

2-(4-(4-bromophenyl)-6-(pyrazin-2-yl)pyridin-2-yl)pyrazine) (5 g, 12.8 mmol), [10-(4-Biphenylyl)-9-anthryl]boronic acid (5.27 g, 14.1 mmol), Tetrakis(triphenylphosphine)palladium(0) (Pd(PPh$_3$)$_4$) (0.44 g, 0.384 mmol), 4M potassium carbonate (K$_2$CO$_3$) (10 ml), 30 ml of toluene, and 10 ml of ethanol were put under a nitrogen atmosphere and then refluxed and stirred for 12 hours. After completion of the reaction, 50 ml of water (H$_2$O) was added, stirred for 3 hours, vacuum-filtered, and then recrystallized with methylene chloride (MC), whereby Compound A01 (6.9 g, yield: 84.6%) was obtained.

Sublimation Purification of A01

The Compound A01 obtained by a wet purification process was sublimed and purified twice at $10^{-6}$ Torr, thereby obtaining a pure yellow crystal compound A01 with 99% purity or higher (4.69 g, sublimation yield: 67.9%).

Hereinafter, an embodiment for the manufacture of an organic light emitting display device according to the present invention will be disclosed. However, the following materials for the electron transport layer do not limit the scope of the present invention.

Comparative Example

An organic light emitting display device was manufactured by forming, on an ITO substrate, a first light emitting part comprising a blue light emitting layer and a first electron transport layer, a second light emitting part comprising a charge generation layer, a yellow-green light emitting layer, and a second electron transport layer, and a cathode. The second electron transport layer was formed of an imidazole derivative.

Embodiment

The organic light emitting display device has the same composition as Comparative Example, and the second electron transport layer includes formed among the following Compound A01.

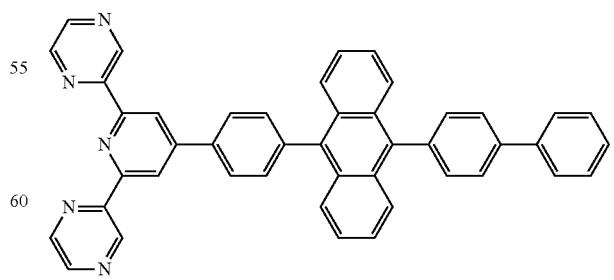

The materials for the electron transport layer in the above Comparative Example and Embodiment do not limit the scope of the present invention.

The operating voltage, efficiency, and external quantum efficiency of the devices manufactured according to Comparative Example and Embodiment were measured and shown in the following Table 1. Also, the current density vs. voltage of the devices was measured and shown in FIG. 4, the external quantum efficiency vs. luminance was measured and shown in FIG. 5, and the light intensity vs. wavelength was measured and shown in FIG. 6.

While Comparative Example and Embodiment use a yellow-green light emitting layer as an example of the light emitting layer, the light emitting layer or electron transport layer included in a light emitting part that emits light of other colors also may be used.

TABLE 1

| Operating Current | | Comparative Example | Embodiment |
|---|---|---|---|
| 10 mA/cm$^2$ | Operating Voltage (V) | 3.3 | 3.2 |
| | Efficiency (Cd/A) | 64.3 | 70.5 |
| | External Quantum Efficiency (%) | 19.0 | 21.1 |
| 50 mA/cm$^2$ | Operating Voltage (V) | 3.9 | 3.8 |

Figure 4:
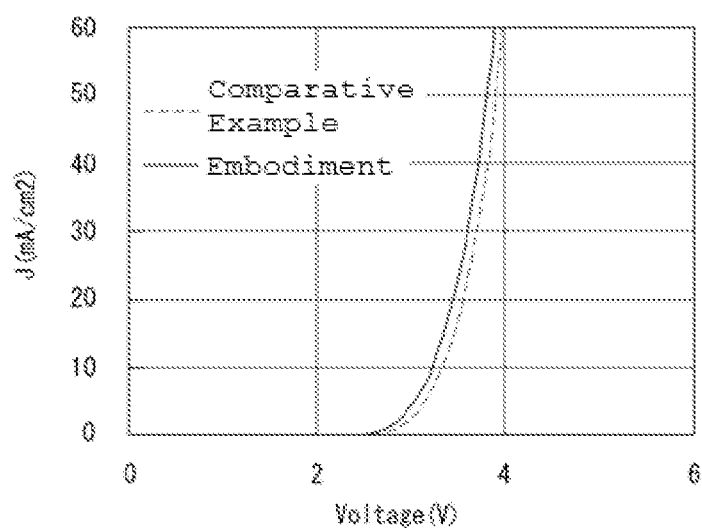
FIG. 4 is a graph of the current density vs. voltage of organic light emitting display devices according to Comparative Example and Embodiment of the present invention.
Figure 5:
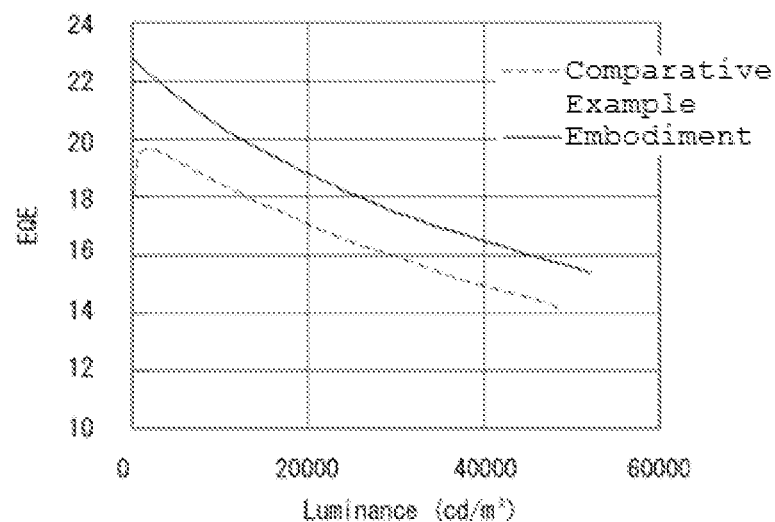
FIG. 5 is a graph of the external quantum efficiency vs. luminance of organic light emitting display devices according to Comparative Example and Embodiment of the present invention.
Figure 6:
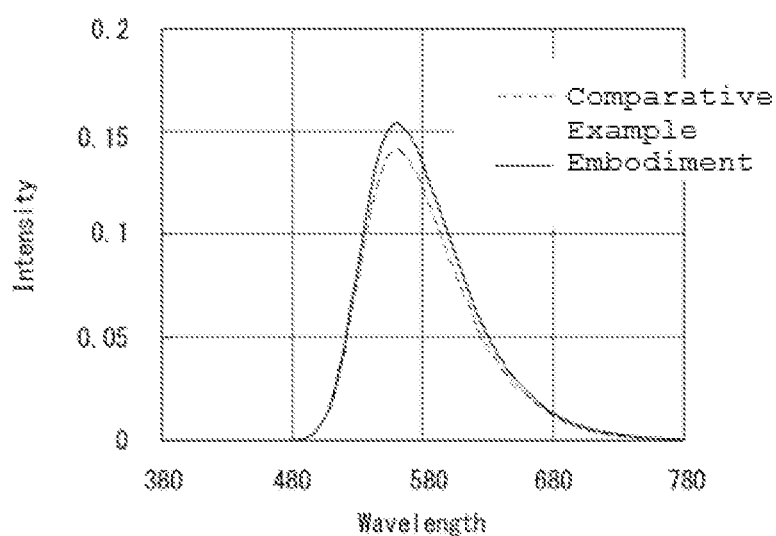
FIG. 6 is a graph of the light intensity vs. wavelength of organic light emitting display devices according to Comparative Example and Embodiment of the present invention.

Referring to Table 1 and FIGS. 4 and 5, when the devices were driven at an operating current of 10 mA/cm$^2$, Embodiment using a pyrimidine derivative as the electron transport layer showed a 0.1 V decrease in operating voltage, a 6.2 cd/A increase in efficiency, and a 2.1% increase in external quantum efficiency, compared to Comparative Example using an imidazole derivative as the electron transport layer. Also, when the devices were driven at an operating current of 50 mA/cm$^2$, Embodiment showed a 0.1 V decrease in operating voltage, compared to Comparative Example. Moreover, referring to FIG. 6, when the devices were driven at an operating current of 10 mA/cm$^2$, Embodiment using a pyrimidine derivative as the electron transport layer showed a considerable increase in light intensity in the same wavelength range, compared to Comparative Example using an imidazole derivative as the electron transport layer.

From these results, it can be found out that the use of a pyrimidine derivative as the electron transport layer reduced the operating voltage and increased the efficiency and external quantum efficiency. Moreover, it can be found out that the use of a pyrimidine derivative as the electron transport layer increased the light intensity of the light emitting layer.

As described above, the present invention allows for smooth transfer of electrons from the N-type charge generation layer to the light emitting layer by using a pyrimidine derivative as at least one among the electron transport layers in the light emitting parts.

Moreover, the pyrimidine derivative, when used as the electron transport layer, facilitates charge transport with its high electron mobility; especially, it facilitates electron transport to the light emitting layer by comprising a pyrimidine having one or more electrons with high electronegativity. In addition, the pyrimidine derivative facilitates transport of electrons from the N-type charge generation layer to the light emitting layer.

Additionally, the use of a pyrimidine derivative as the electron transport layer offers the advantage of increasing emission efficiency and reducing operating voltage by facilitating transfer of electrons from the N-type charge generation layer to the electron transport layer.

It will be apparent to those skilled in the art that various modifications and variations can be made in the organic light emitting display device of the present invention without departing from the spirit or scope of the invention. Thus, it is intended that the present invention cover the modifications and variations of this invention provided they come within the scope of the appended claims and their equivalents.

What is claimed is:

1. An organic light emitting display device, comprising:
    at least two light emitting parts between an anode and a cathode, each of the light emitting parts having a light emitting layer and an electron transport layer; and
    charge generation layers between the at least two light emitting parts,
    wherein at least one among the electron transport layers in the at least two light emitting parts includes a compound represented by the following Formula 1:

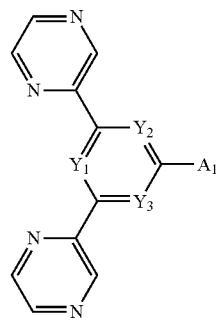

Formula 1 where:
    $Y_1$, $Y_2$, and $Y_3$ are independently one among N, C, O, S, and Si, wherein at least one among $Y_1$, $Y_2$, and $Y_3$ is N, and
    $A_1$ is one among A-01 to A-79:

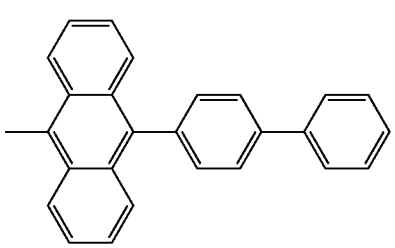

A-01

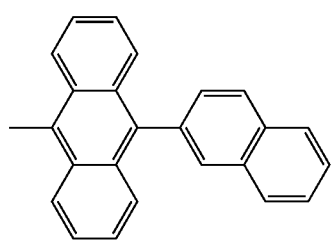

A-02

A-03
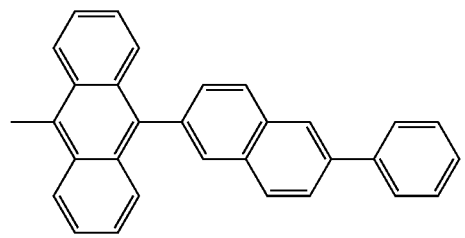
A-04
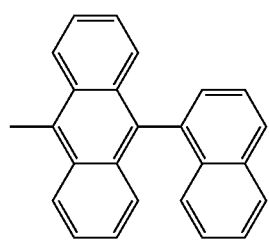
A-05
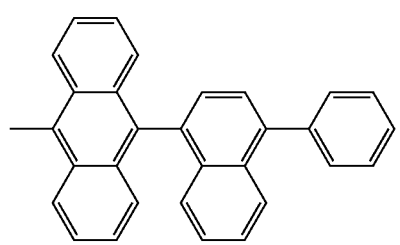
A-06
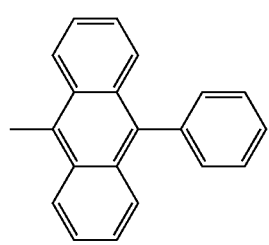
A-07
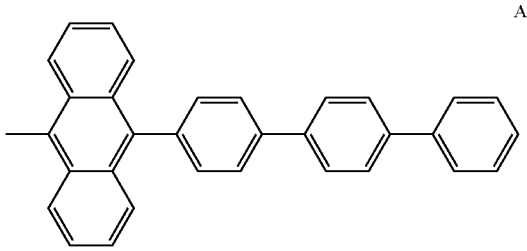
A-08
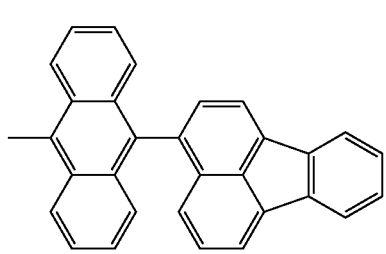
A-09
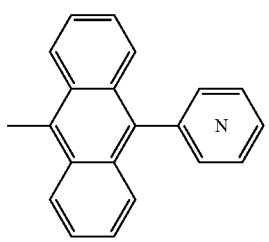
A-10
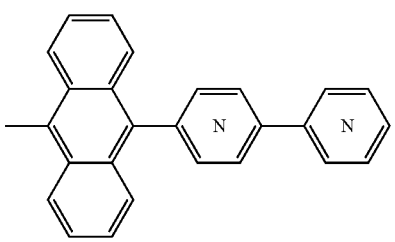
A-11
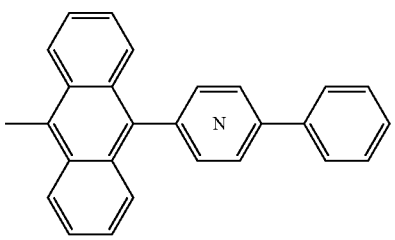
A-12
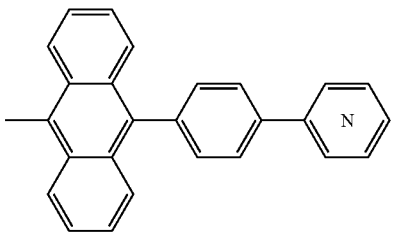
A-13
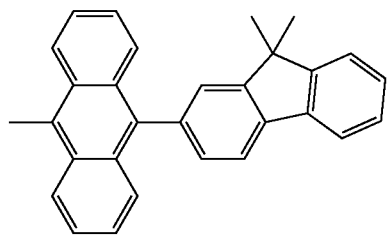
A-14
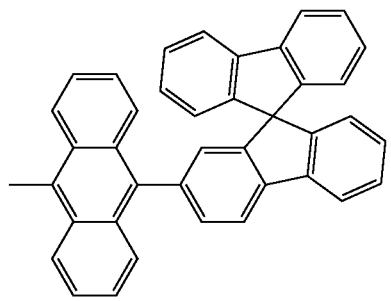

-continued
A-15
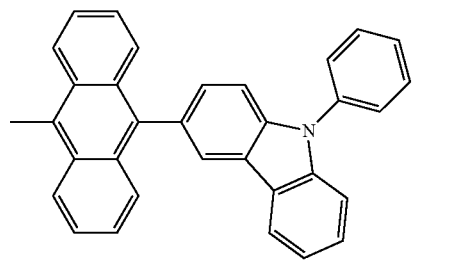
A-16
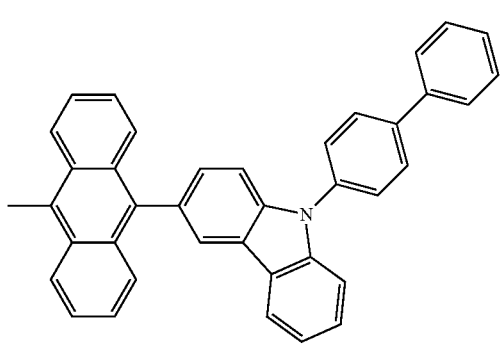
A-17
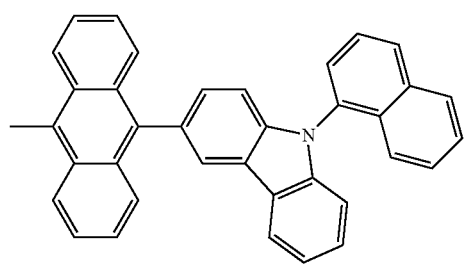
A-18
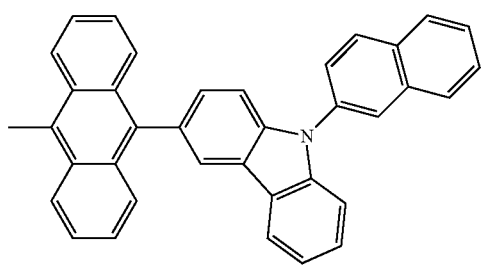
A-19
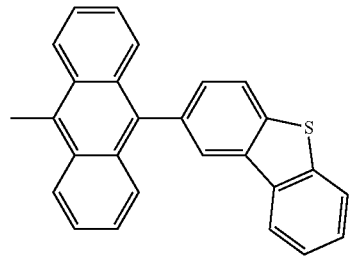
A-20
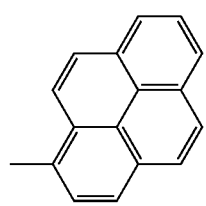
-continued
A-21
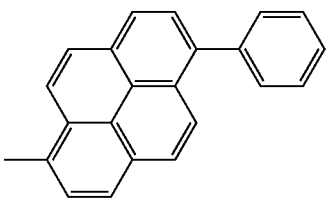
A-22
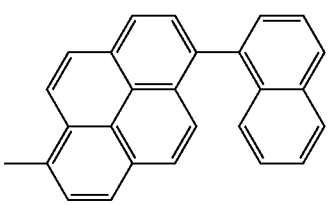
A-23
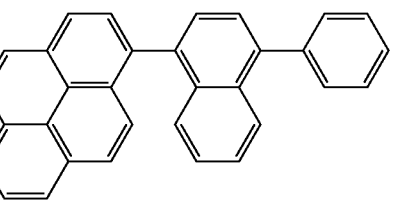
A-24
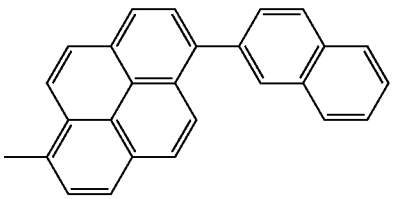
A-25
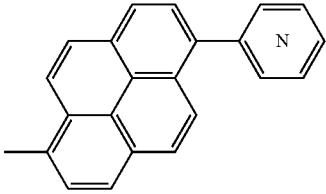
A-26
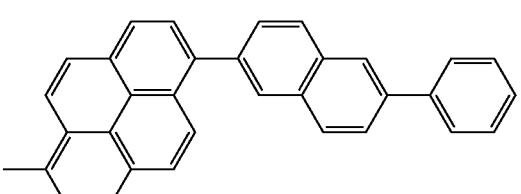
A-27
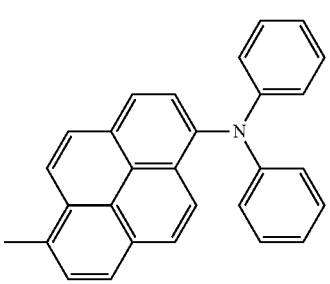

A-28
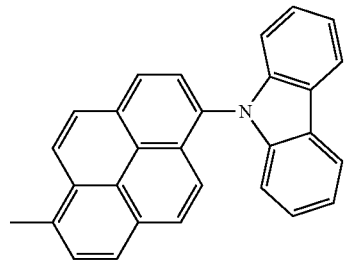
A-29
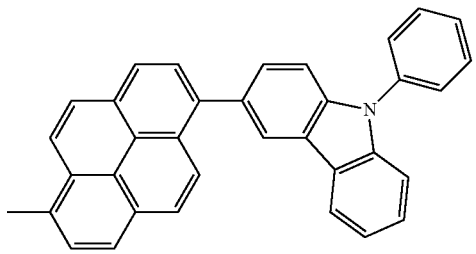
A-30
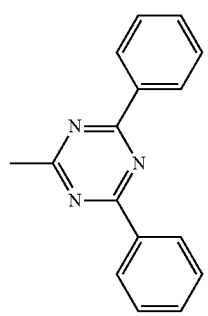
A-31
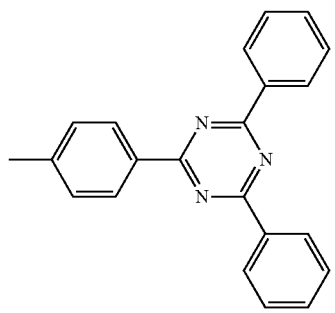
A-32
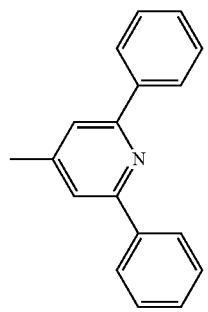
A-33
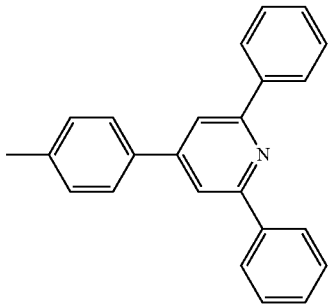
A-34
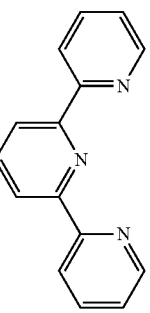
A-35
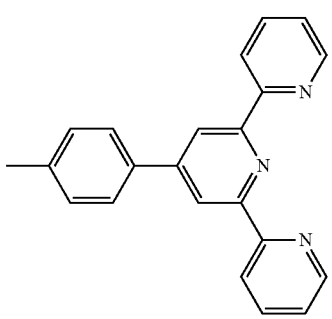
A-36
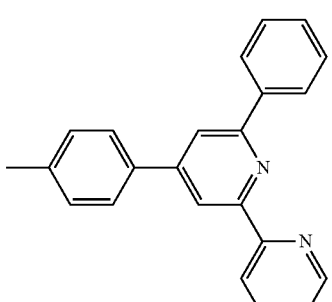
A-37
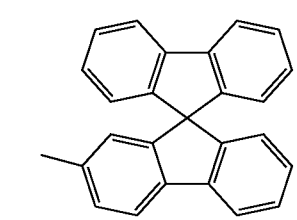

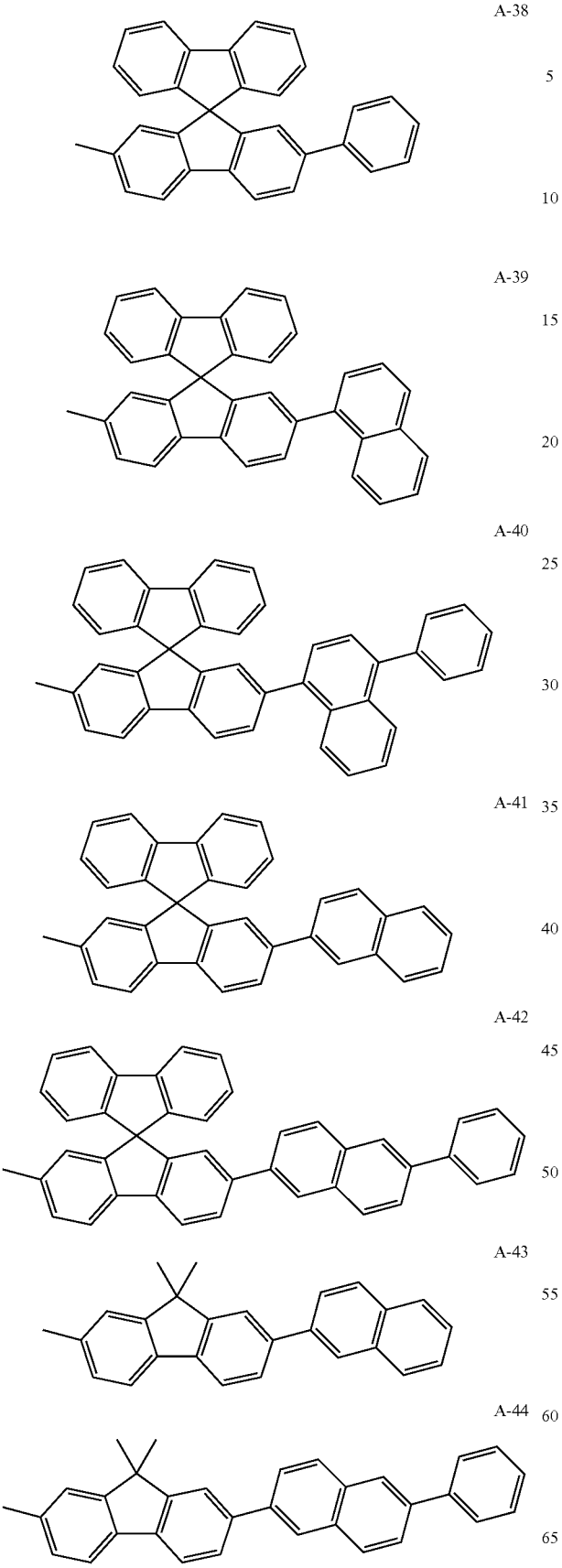
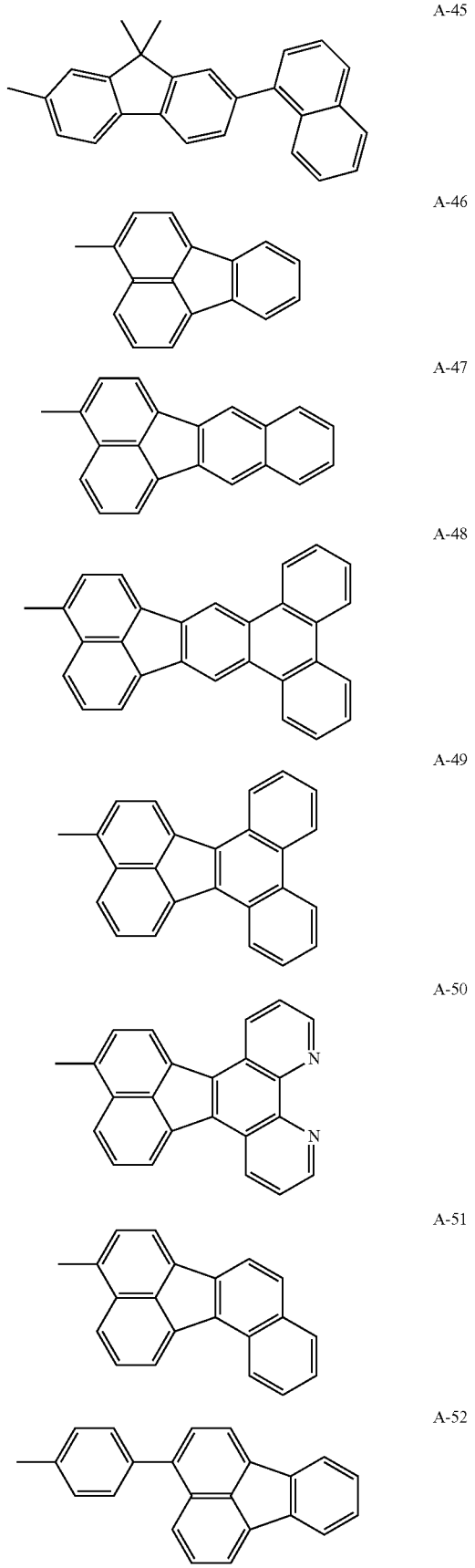

A-53
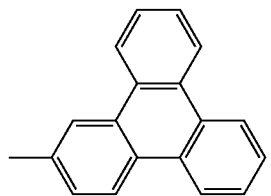
A-54
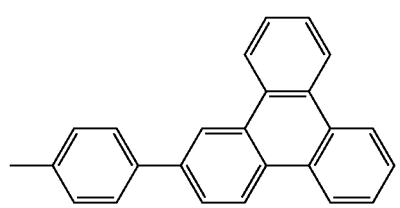
A-55
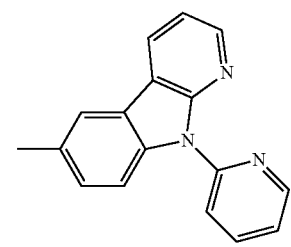
A-56
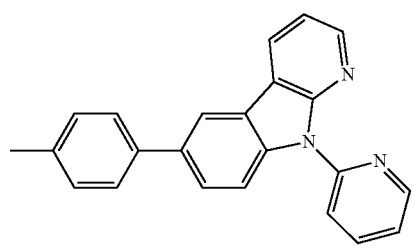
A-57
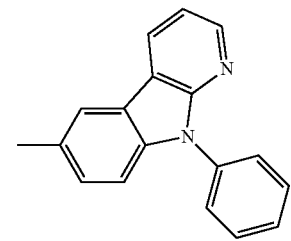
A-58
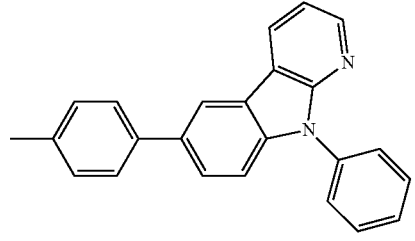
A-59
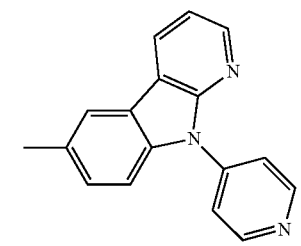
A-60
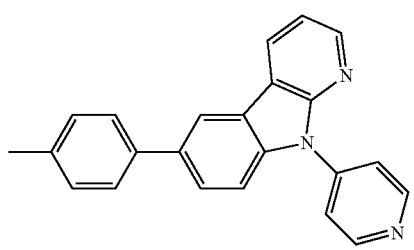
A-61
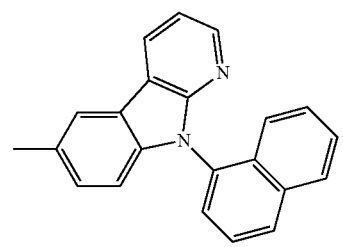
A-62
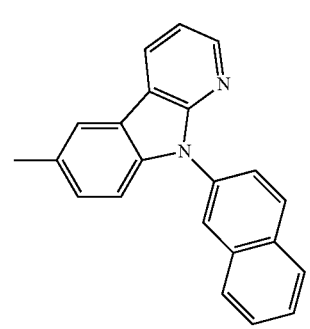
A-63
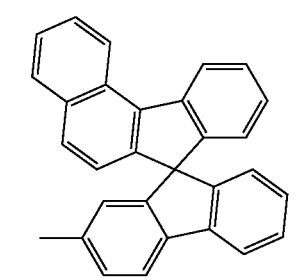
A-64
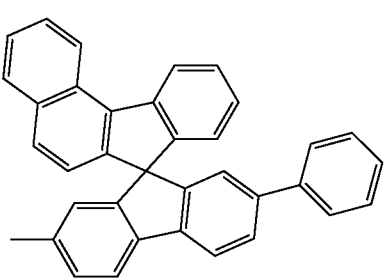

-continued
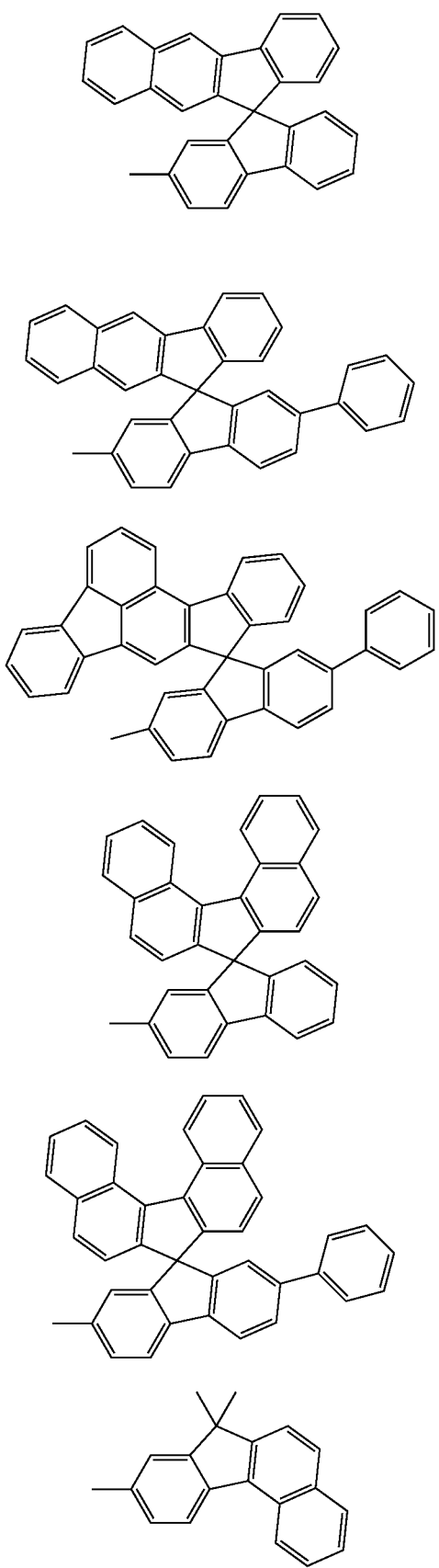
A-65
A-66
A-67
A-68
A-69
A-70
-continued
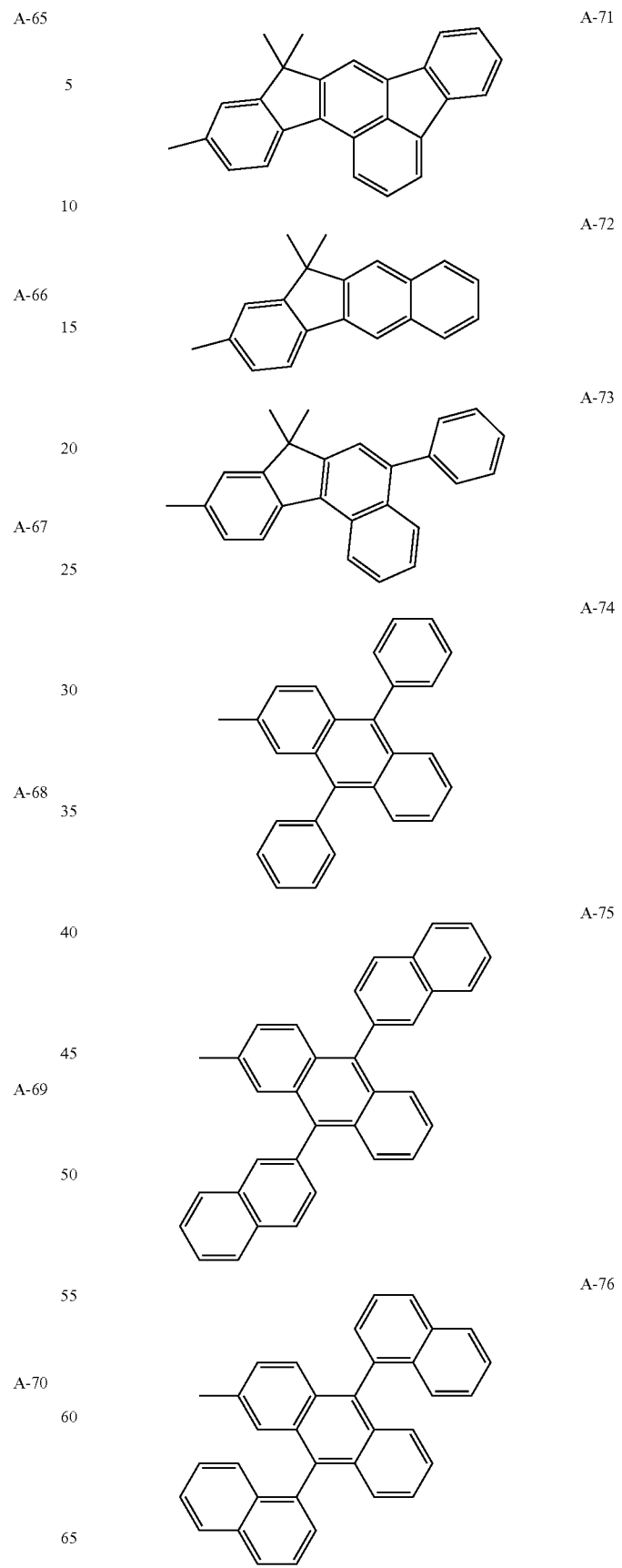
A-71
A-72
A-73
A-74
A-75
A-76

-continued
A-77
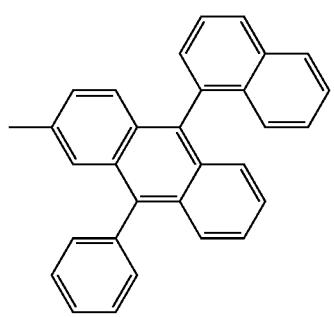
A-78
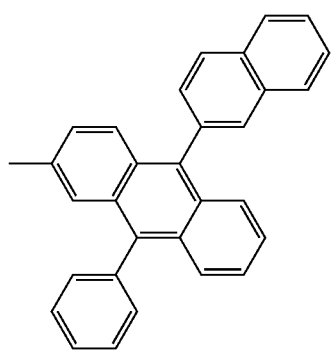
A-79
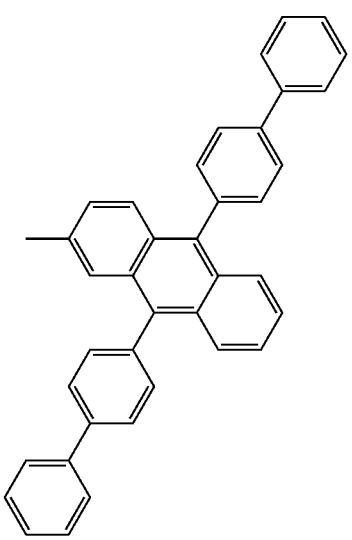
where
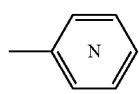
is one among
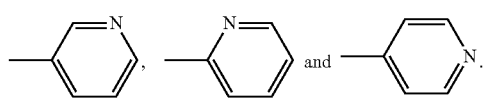
2. The organic light emitting display device of claim 1, wherein the compound includes one among the compounds Py-1 to Py-5:
Py-1
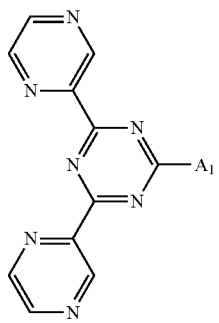
Py-2
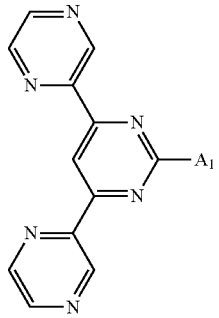
Py-3
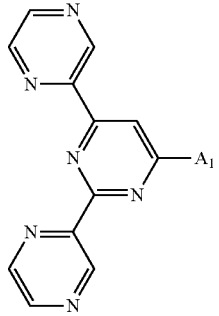
Py-4
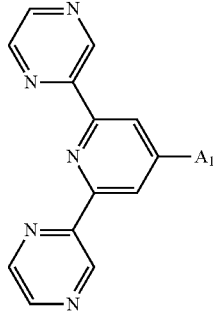
Py-5
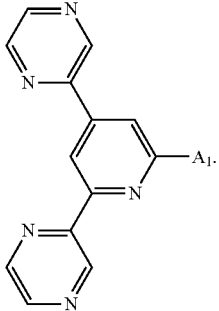

3. The organic light emitting display device of claim 1, wherein an organic light emitting display device comprising the compound has a reduced operating voltage and an increased efficiency, as compared with an organic light emitting display device without the compound.

4. The organic light emitting display device of claim 1, wherein the at least two light emitting parts include:
   a first light emitting part having a first light emitting layer; and
   a second light emitting part having a second light emitting layer.

5. The organic light emitting display device of claim 4, wherein the first light emitting layer includes a blue light emitting layer, the second light emitting layer includes a yellow-green light emitting layer, and the electron transport layer adjacent to the yellow-green light emitting layer includes the compound.

6. The organic light emitting display device of claim 1, wherein the at least two light emitting parts include:
   a first light emitting part having a first light emitting layer;
   a second light emitting part having a second light emitting layer; and
   a third light emitting part having a third light emitting layer.

7. The organic light emitting display device of claim 6, wherein the first light emitting layer includes a blue light emitting layer, the second light emitting layer includes a yellow-green light emitting layer, the third light emitting layer includes a blue light emitting layer, and the electron transport layer adjacent to the yellow-green light emitting layer includes the compound.

8. An organic layer present in an organic light emitting display device, the organic layer comprising a compound represented by the following Formula 1

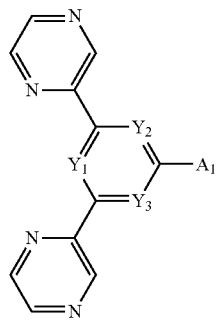

where:
$Y_1$, $Y_2$, and $Y_3$ are independently one among N, C, O, S, and Si, wherein at least one among $Y_1$, $Y_2$, and $Y_3$ is N, and
$A_1$ is one among A-01 to A-79:

A-01

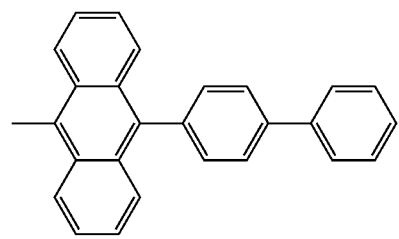

-continued

A-02

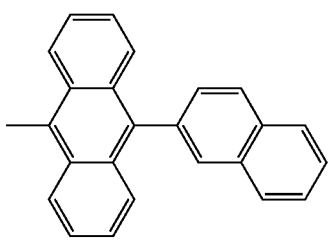

A-03

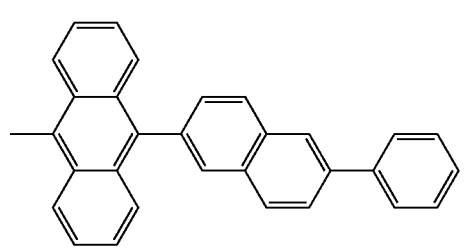

A-04

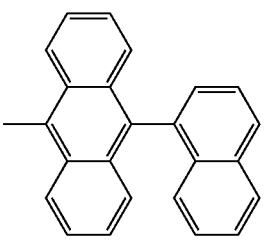

A-05

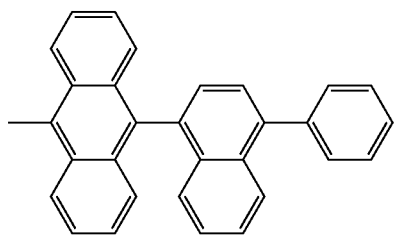

A-06

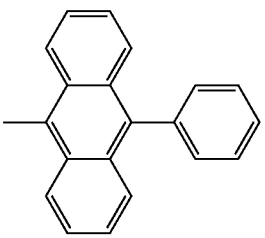

A-07

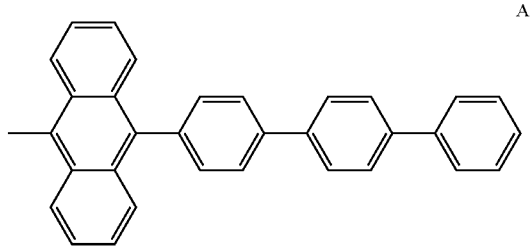

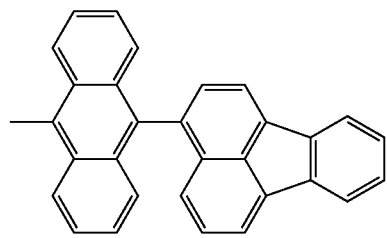
A-08
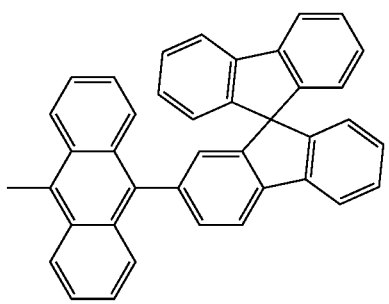
A-14
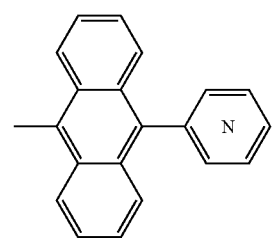
A-09
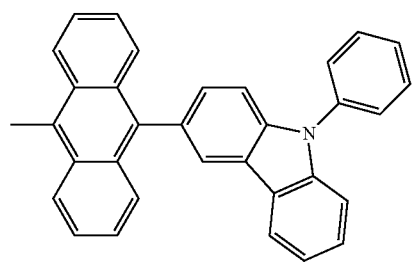
A-15
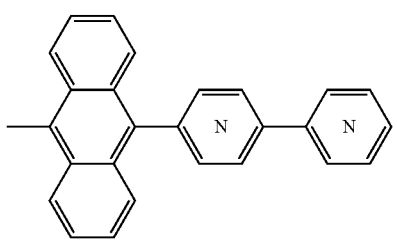
A-10
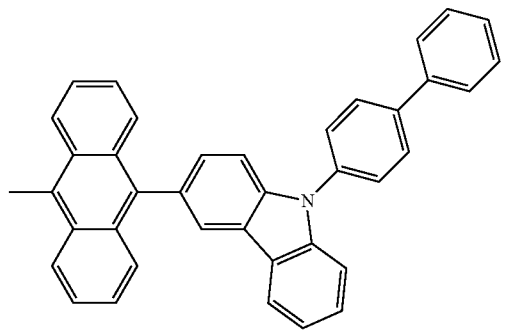
A-16
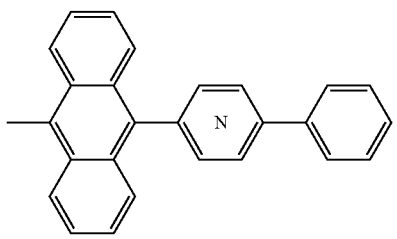
A-11
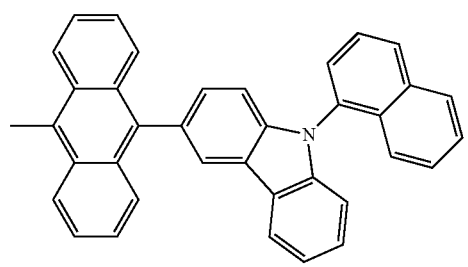
A-17
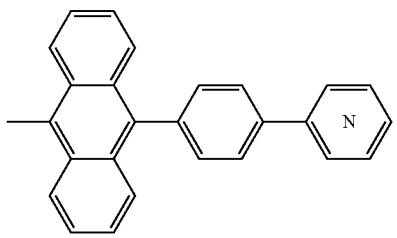
A-12
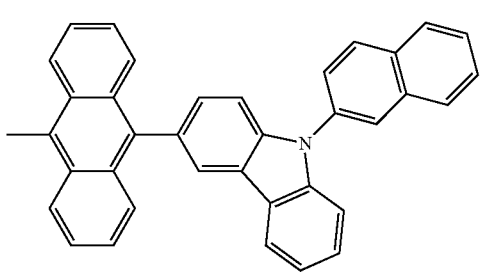
A-18
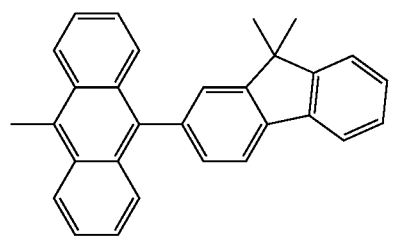
A-13

A-19 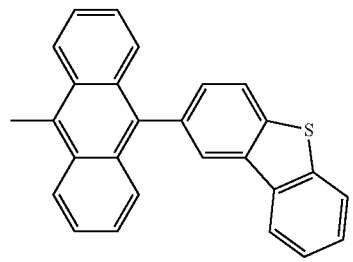
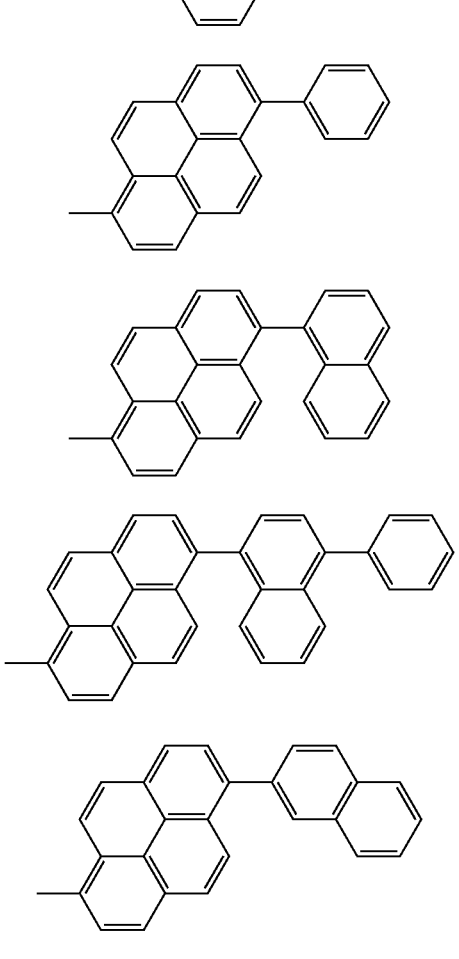
A-20
A-21
A-22
A-23
A-24
A-25
A-26 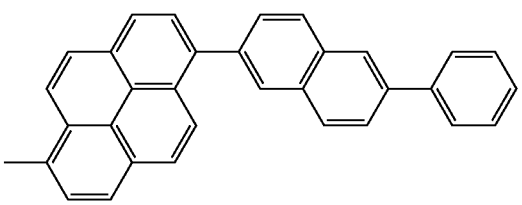
A-27 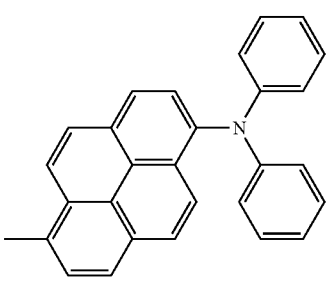
A-28 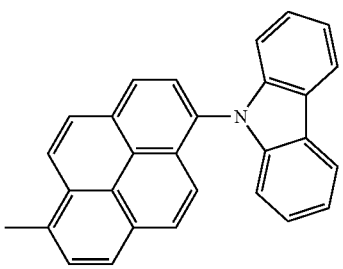
A-29 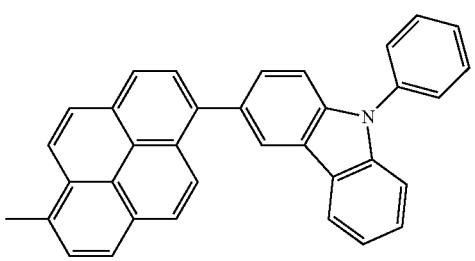
A-30 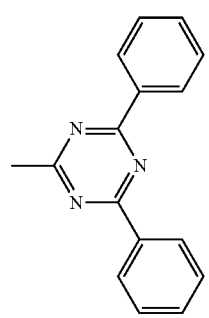

A-31
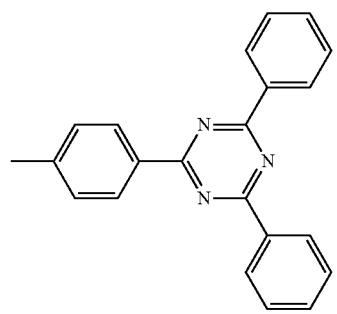
A-32
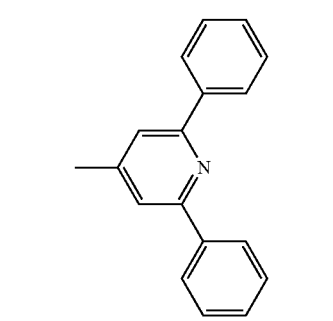
A-33
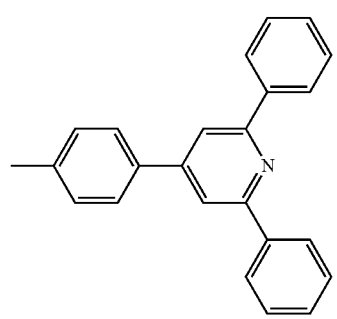
A-34
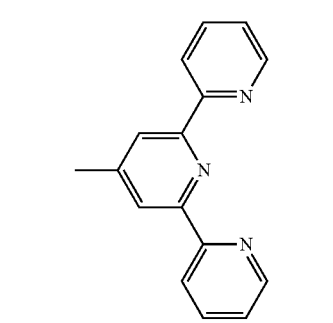
A-35
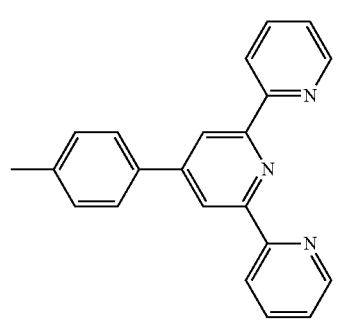
A-36
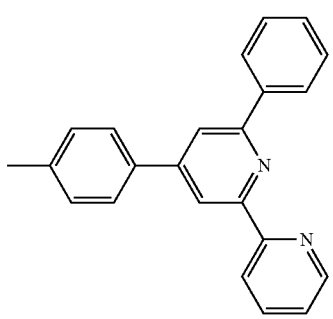
A-37
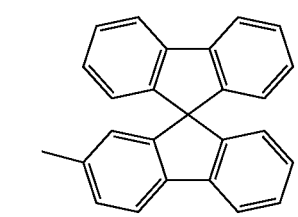
A-38
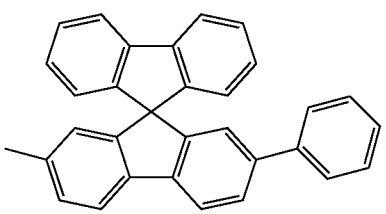
A-39
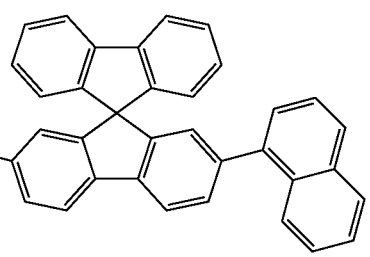
A-40
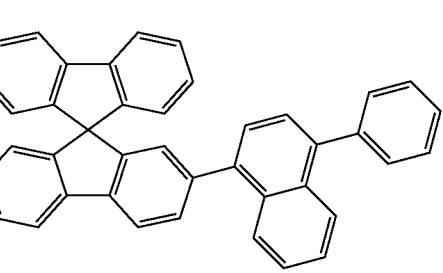
A-41
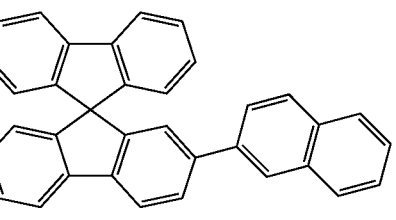

-continued
A-42
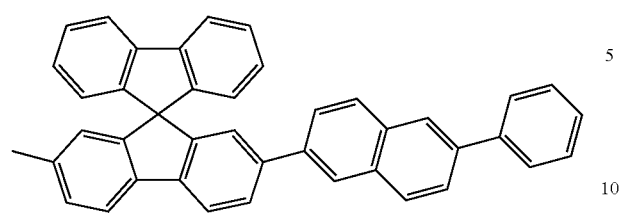
A-43
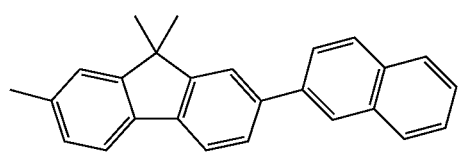
A-44
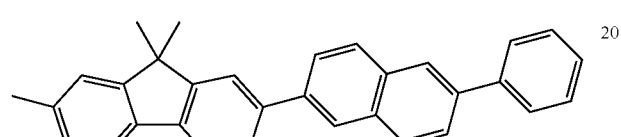
A-45
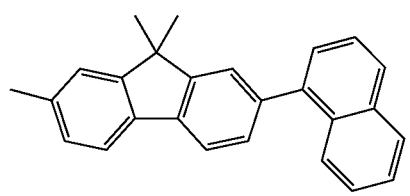
A-46
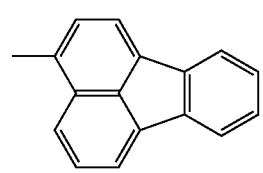
A-47
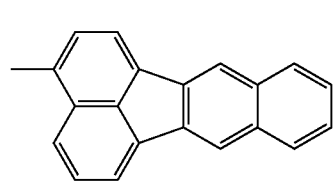
A-48
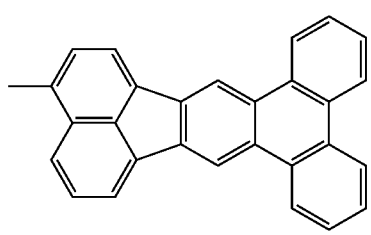
A-49
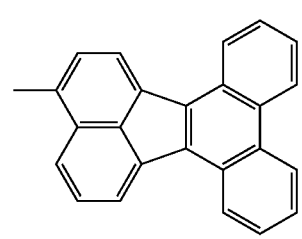
-continued
A-50
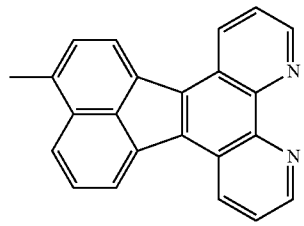
A-51
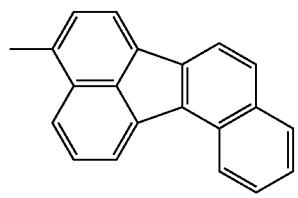
A-52
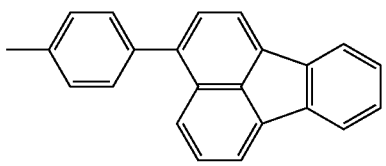
A-53
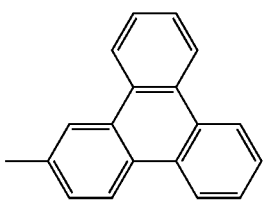
A-54
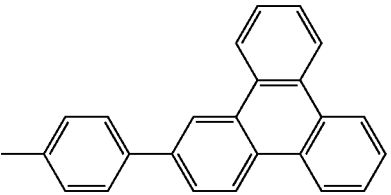
A-55
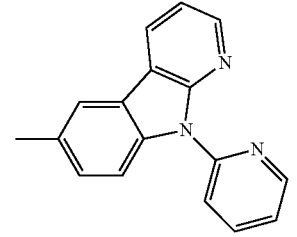
A-56
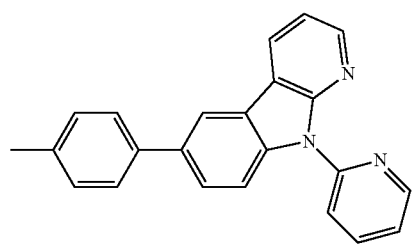

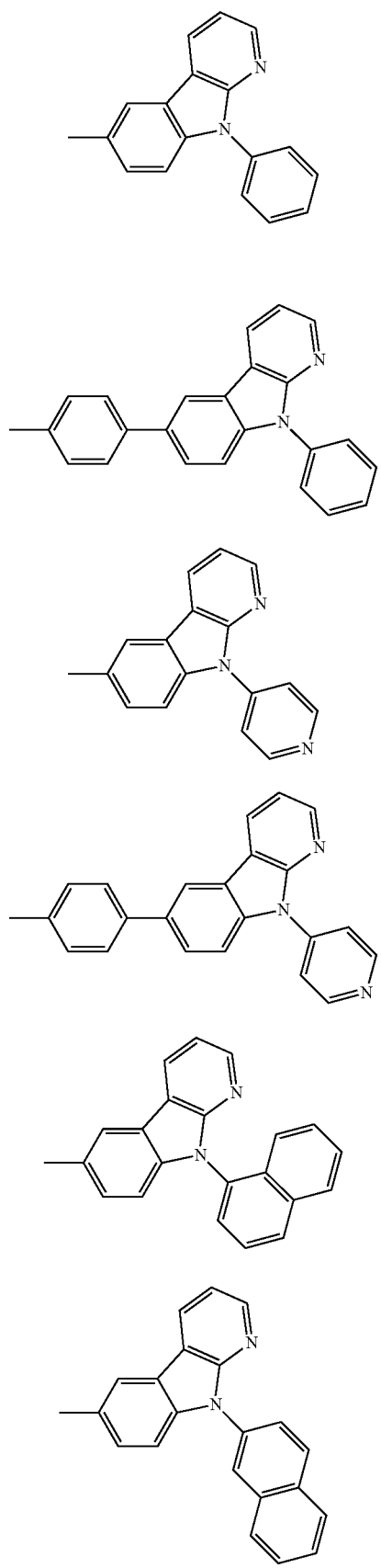
A-57
A-58
A-59
A-60
A-61
A-62
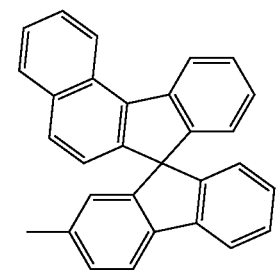
A-63
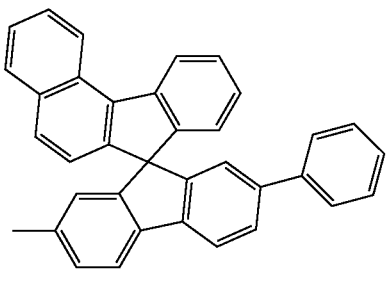
A-64
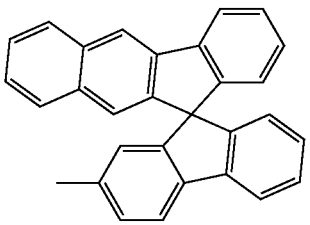
A-65
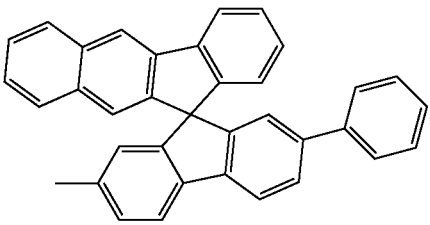
A-66
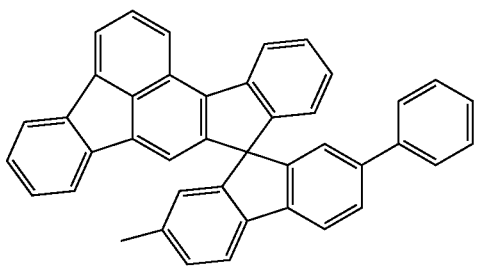
A-67
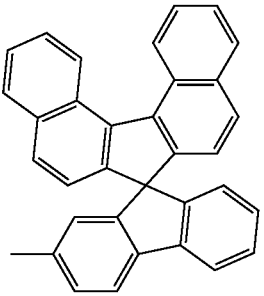
A-68

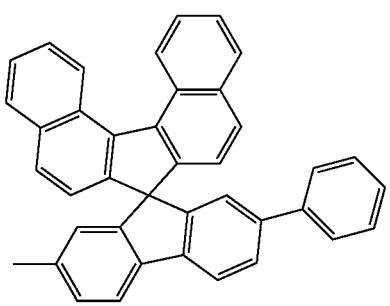
A-69
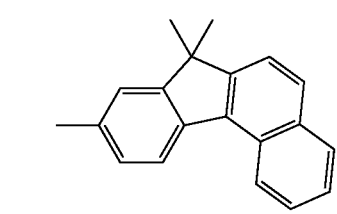
A-70
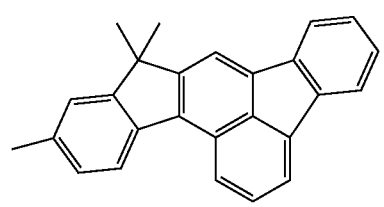
A-71
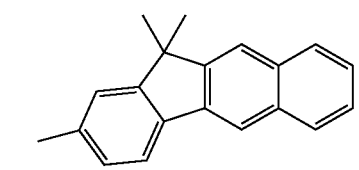
A-72
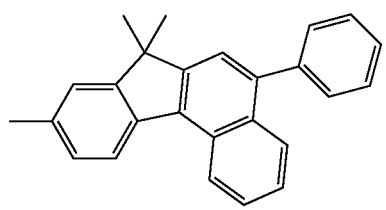
A-73
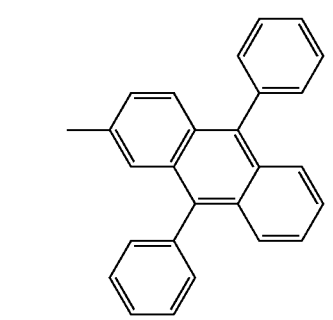
A-74
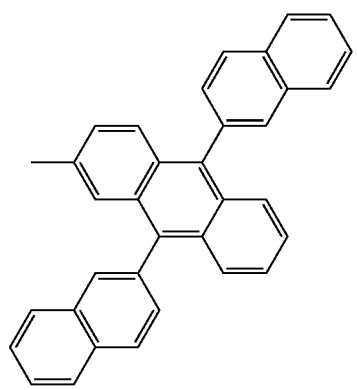
A-75
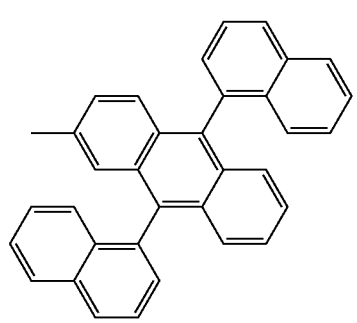
A-76
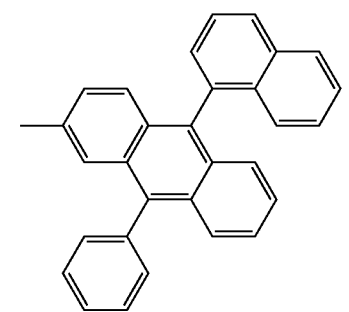
A-77
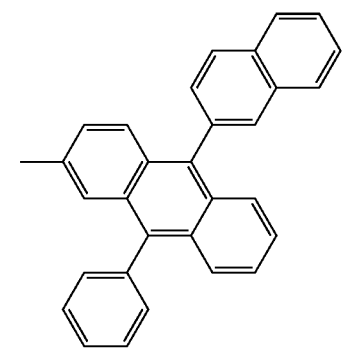
A-78

-continued
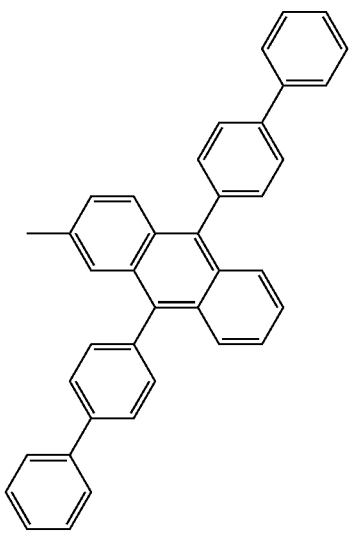
A-79
where 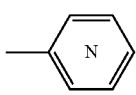 is one among
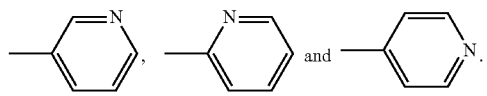
9. The organic layer of claim 8, wherein the compound includes one among the compounds Py-1 to Py-5:
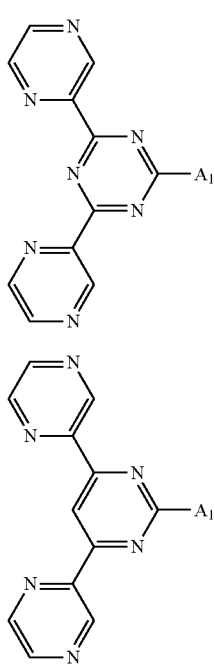
Py-1
Py-2
-continued
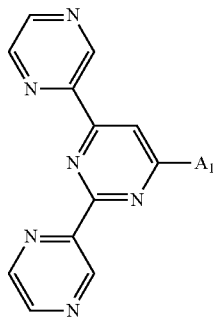
Py-3
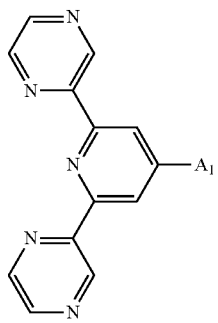
Py-4
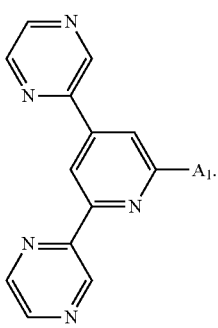
Py-5
10. The organic light emitting display device of claim 9, wherein the compound is Py-1:
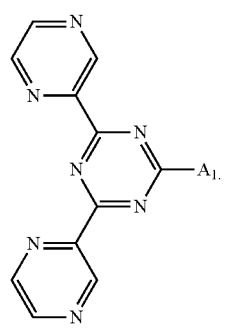
11. The organic light emitting display device of claim 9, wherein the compound is Py-2:

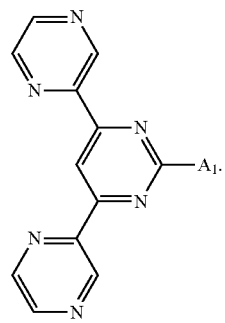
12. The organic light emitting display device of claim 9, wherein the compound is Py-3:
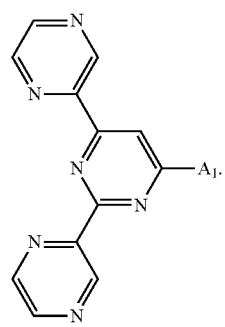
13. The organic light emitting display device of claim 9, wherein the compound is Py-4:
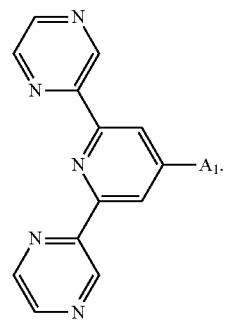
14. The organic light emitting display device of claim 9, wherein the compound is Py-5:
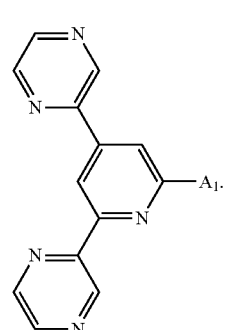
* * * * *